United States Patent
Morita

(10) Patent No.: US 6,788,137 B2
(45) Date of Patent: Sep. 7, 2004

(54) SWITCHING AMPLIFIER AND SIGNAL AMPLIFYING METHOD

(75) Inventor: Koichi Morita, Saitama (JP)

(73) Assignee: Sanken Electric Co., Ltd., Saitama (JP)

(*) Notice: Subject to any disclaimer, the term of this patent is extended or adjusted under 35 U.S.C. 154(b) by 0 days.

(21) Appl. No.: 10/165,001

(22) Filed: Jun. 7, 2002

(65) Prior Publication Data

US 2002/0190789 A1 Dec. 19, 2002

(30) Foreign Application Priority Data

Jun. 7, 2001 (JP) .................................... 2001-173071

(51) Int. Cl.[7] .............................. H03F 3/38; H03F 3/217
(52) U.S. Cl. ........................................ 330/10; 330/251
(58) Field of Search ............................... 330/10, 124 R, 330/207 A, 251, 295

(56) References Cited

U.S. PATENT DOCUMENTS 5,969,571 A * 10/1999 Swanson ...................... 330/10
5,990,735 A * 11/1999 Sigmon et al. ............... 330/10

* cited by examiner

Primary Examiner—Steven J. Mottola
(74) Attorney, Agent, or Firm—Howard & Howard

(57) ABSTRACT

First and second controllers generate pulse signals whose duty ratio are modulated based on an audio signal and whose frequencies are shifted 180 degree with each other. First and second amplification sections perform switching operation to switching a direct current voltage to generate power-pulse signals whose phases are shifted 180 degree with each other and whose duty ratio are modulated in accordance with the audio signal. The first and second amplification sections supply the power-pulse signals to a filtering section. At the filtering section, the two power-pulse signals are synthesized, thereby canceling the fundamental wave components of the power-pulse signals. A filtering section cuts off the higher harmonics components and reproduces the audio signal, and supplies the speaker with the audio signals.

5 Claims, 15 Drawing Sheets

FIG. 2A
AUDIO SIGNAL S1
FIG. 2B
CLOCK SIGNAL S2
FIG. 2C
CLOCK SIGNAL S3
(SHIFTED BY 0 DEGREE)
FIG. 2D
TRIANGULAR-WAVE SIGNAL
S4
AUDIO SIGNAL S1
FIG. 2E
PULSE SIGNAL S5
FIG. 2F
PULSE SIGNAL S6
FIG. 2G
CLOCK SIGNAL S7
(SHIFTED BY 180 DEGREE)
FIG. 2H
TRIANGULAR-WAVE
SIGNAL S4
AUDIO SIGNAL S1
FIG. 2I
PULSE SIGNAL S9
FIG. 2J
PULSE SIGNAL S10
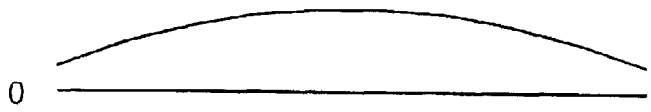
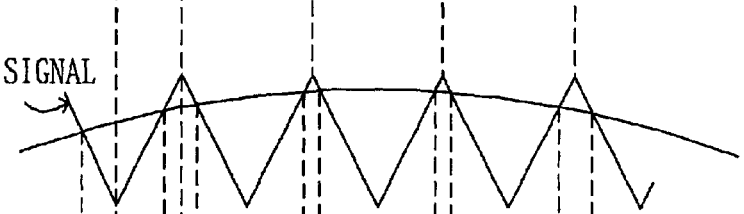
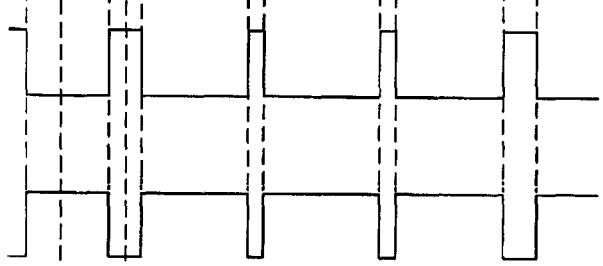
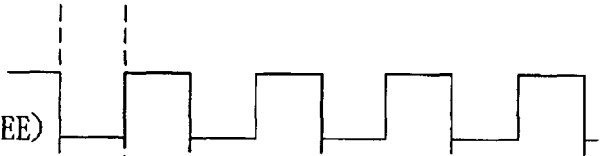
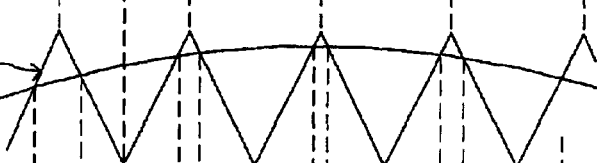
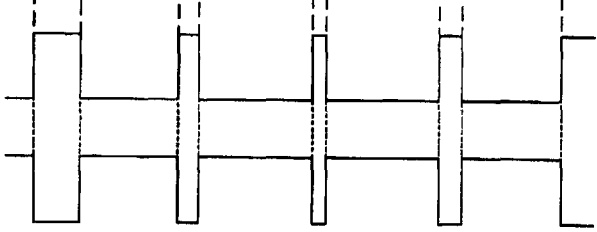

OUTPUT SIGNAL S11 OF AMPLIFICATION SECTION 1-1 (POWER-PULSE SIGNAL S11)

OUTPUT SIGNAL S12 OF AMPLIFICATION SECTION 1-2 (POWER-PULSE SIGNAL S12)

SYNTHESIZED SIGNAL S13

OUTPUT OF SPEAKER 5 (AUDIO)

POWER-PULSE
SIGNAL S11

POWER-PULSE
SIGNAL S12

SYNTHESIZED
SIGNAL S13

OUTPUT SIGNAL
OF FILTERING
SECTION2
S14

A = AMPLITUDE  T = PULSE WIDTH
(COSINE FUNCTION ONLY)

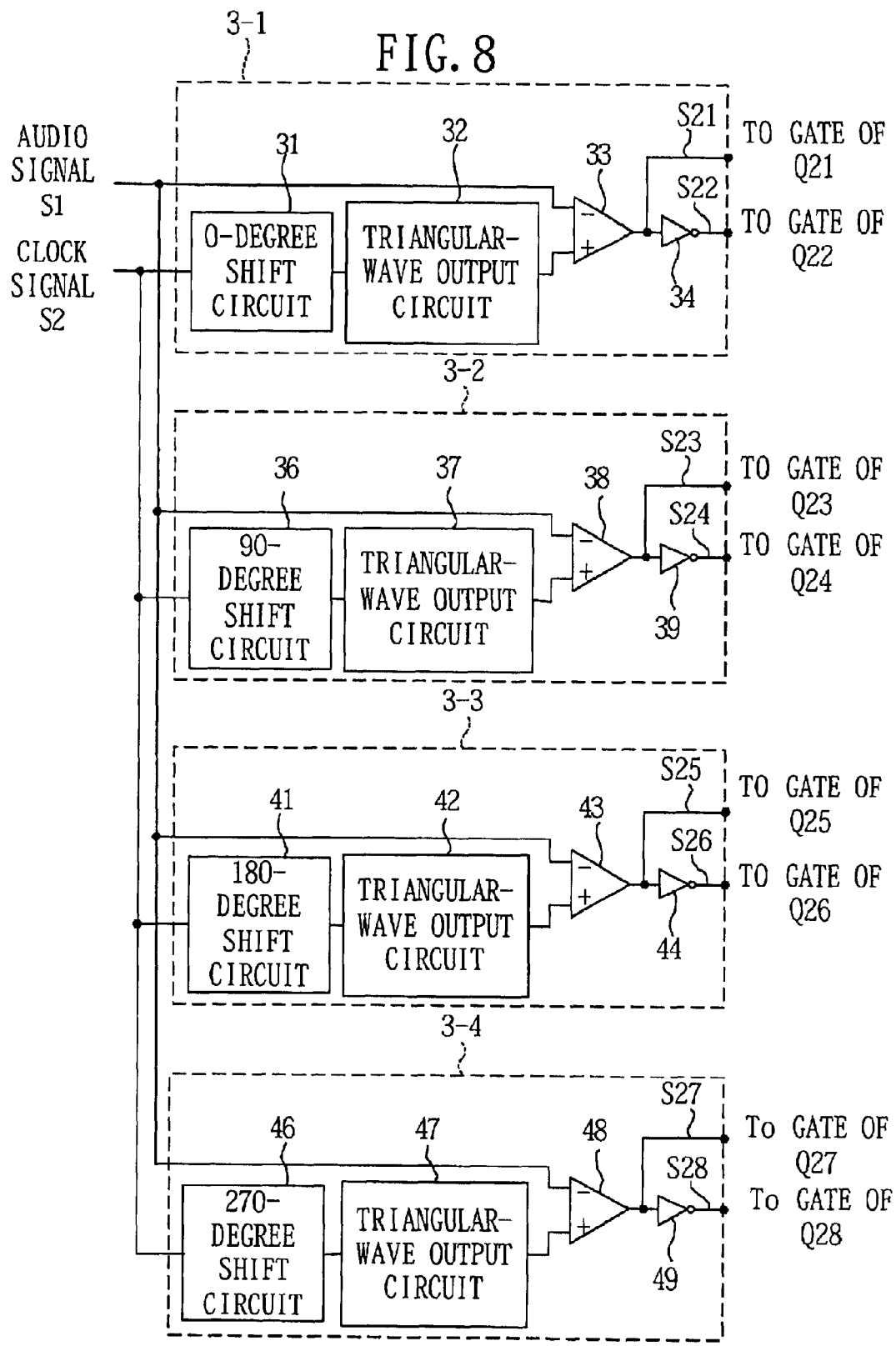

POWER-PULSE
SIGNAL S29

POWER-PULSE
SIGNAL S30

POWER-PULSE
SIGNALS31

POWER-PULSE
SIGNAL S32

SYNTHESIZED
SIGNAL S33

OUTPUT SIGNAL
OF FILTERING
SECTION2
S34

FIG. 12A
AUDIO SIGNAL S41
FIG. 12B
CLOCK SIGNAL S42
FIG. 12C
TRIANGULAR-WAVE SIGNAL S43
AUDIO SIGNAL S41
FIG. 12D
PULSE SIGNAL S44
FIG. 12E
PULSE SIGNAL S45
FIG. 12F
TRIANGULAR-WAVE SIGNAL S43
INVERTED-AUDIO SIGNAL S46
FIG. 12G
PULSE SIGNAL S47
FIG. 12H
PULSE SIGNAL S48
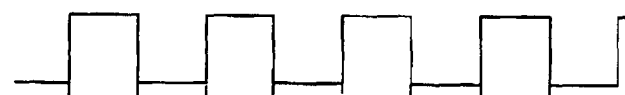
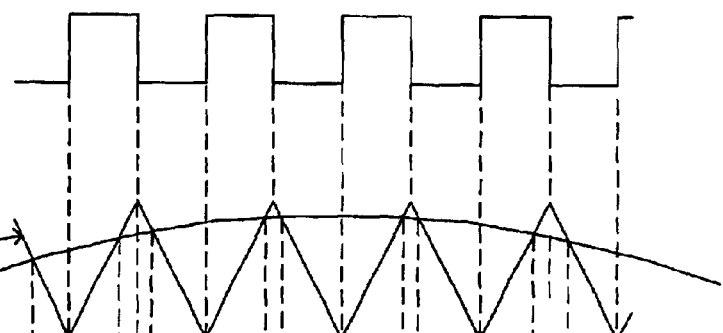
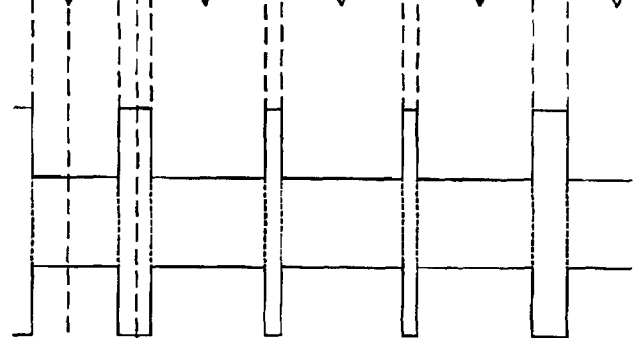
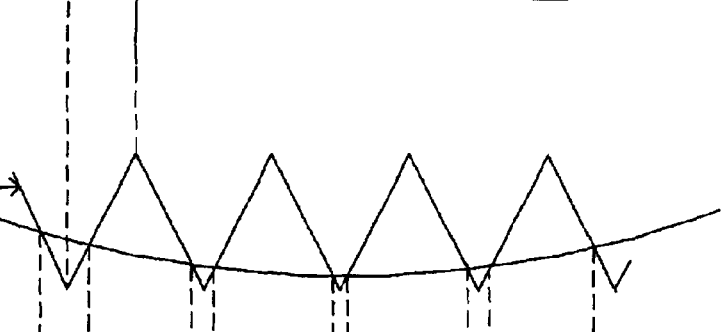
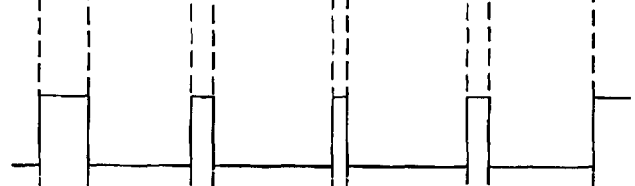
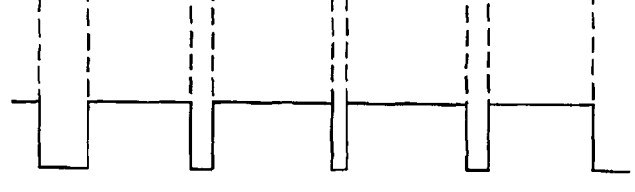

SWITCHING AMPLIFIER AND SIGNAL AMPLIFYING METHOD

BACKGROUND OF THE INVENTION

1. Field of the Invention

The present invention relates to a switching amplifier and a signal amplifying method.

2. Description of the Related Art

There are audio amplifiers comprised of switching amplifiers which control switching devices, so as to amplify audio signals.

Conventional switching amplifiers have the following problems to be solved.

A high-performance filter having a complicated structure is needed for cutting off a switching frequency component(s) of a PWM signal, especially, a fundamental wave component(s) having a high energy.

To reproduce audio with high fidelity, it is necessary that the upper limit of the frequency bandwidth of the switching amplifier be set equal to or greater than 100 kHz. To establish that upper limit of the frequency bandwidth, it is necessary to set the switching frequency at or greater than 2 MHz.

However, it is difficult for the switching devices to switch at or grater than 2 MHz in a stable manner. For example, if a regular FET (Field Effect Transistor) is used as a switching device, the regular FET does not have an enough ability of switching at or greater than 2 MHz. Therefore, setting the switching frequency at or greater than 2 MHz causes a delay of the switching and a dispersion of the switching time. Such a delay and the dispersion affect a dead time which is set for preventing a through current flowing through the plurality of switching devices, resulting in large consumption power, and a distortion rate of output of the switching amplifier is aggravated.

The switching frequency may be set at 2 MHz, by decreasing the source voltage of the switching devices. However, if the source voltage is decreased, the amplification factor is decreased as well. As a result of this, the switching amplifier can not produce a large output.

To overcome the above problems that the switching amplifier can not produce a large output, a BTL (Balanced Transformer Less) circuit may be employed in the switching amplifier. The BTL circuit is a full-bridge circuit which amplifies an original signal by a push-pull operation. The BTL circuit has characteristics that a large output can be obtained from the circuit, even if its source voltage is relatively low.

However, even in a switching amplifier using a BTL circuit, it is necessary to set the switching frequency of the switching devices at or greater than 2 MHz. Thus, it is difficult that the switching devices perform switching in a stable manner in the switching amplifier if, for example, a regular FET is used as a switching device.

SUMMARY OF THE INVENTION

The present invention has been made in consideration of the above. It is accordingly an object of the present invention to provide a switching amplifier and signal amplifying method, which have lower switching frequency relatively and which reproduce an original signal with high fidelity.

Another object thereof is to provide a switching amplifier and a signal amplifying method, which output an amplified signal with a lower distortion rate relatively.

In order to accomplish the above objects, according to the first aspect of the present invention, there is provided a switching amplifier which generates pulse signals, sets a duty ratio of each of the pulse signals in accordance with a signal level of an original signal to be amplified, switches a direct-current voltage in accordance with each of the pulse signals to generate power-pulse signals, and filters the power-pulse signals, thereby amplifying the original signal and supplies a load with the power-pulse signals.

The amplifier comprises: a pulse-signal generator which generates the pulse signals, each of which has a duty ratio corresponding to the signal level of the original signal and is out of phase with respect to each other; a plurality of amplification sections, which has switching devices, which inputs each of the plurality of pulse signals and performs switching of the direct-current voltage in accordance with the duty ratio of each of the pulse signals, thereby generating a plurality of power-pulse signals which are out of phase; and a filter which combines and filters the plurality of power-pulse signals output from said plurality of amplification sections, and supplies said load with the combined and filtered power-pulse signals.

The filter may include reactors, each of which is coupled to respective one of said plurality of amplification sections for combining the power-pulse signals.

Each of said plurality of amplification sections may include switching devices, which are coupled to a power source applying a direct-current voltage and perform switching of the direct-current voltage. In this case, it is desirable that the pulse-signal generator inverts the plurality of pulse signals, and outputs the plurality of pulse signals and the plurality of inverted signals to said plurality of amplification sections.

Each of said plurality of amplification sections may include switching devices, which are coupled to a power source applying a direct-current voltage and perform switching of the direct-current voltage; and said pulse-signal generator inverts the plurality of pulse signals, and outputs the plurality of pulse signals and the plurality of inverted signals to said plurality of amplification sections.

The switching amplifier may further comprises: a shifting section which shifts a phase of a clock signal by predetermined degrees, so as to generate shifted clock signals; a reference signal generator which generates reference signals from the sifted clock signals which are output from said shifting section; a modulator which compares the original signal to be amplified with the reference signals, thereby modulating the duty ratio of each of the plurality of pulse signals and supplying switching devices of each of the amplification sections with the pulse signals; and an inverter which inverts each of the plurality of pulse signals whose duty ratio has been modulated, and supplies the switching devices of each of the amplification sections with the pulse signals, respectively.

In the switching amplifier, each of the plurality of amplification sections may includes two switching devices, which are arranged in series and accept the direct-current voltage supplied thereto. In this case, a load is coupled to a coupling point of the two serially-arranged switching devices of each of the plurality of amplification sections, through said filter, thereby forming a half or full-bridge circuit; and said pulse-signal generator generates a plurality of pulse signals, which are out of phase with each other, and their inverted signals, and supplies each pair of one of the pulse signals and respective inverted signals to the two serially-arranged switching devices of respective one of said amplification sections.

In the switching amplifier, said pulse-signal generator may include: a comparing-reference signal generator which generates a comparing-reference signal in accordance with phases of the clock signals; a first pulse-signal generator which compares the original signal to be amplified with the comparing-reference signal generated by said comparing-reference signal generator, so as to output a first pulse signal; a first inverted-pulse signal generator which inverts said first pulse signal generated by said first pulse-signal generator, so as to output a first inverted pulse signal; an original-signal inverter which inverts the original signal to be amplified; a second pulse-signal generator which compares the signal, inverted by said original-signal inverter, with the comparing-reference signal generated by said comparing-reference signal generator, so as to output a second pulse signal; a second inverted-pulse signal generator which inverts said second pulse signal generated by said second pulse-signal generator, so as to output a second inverted pulse signal.

The filter may be able to attenuate signal components whose frequencies are higher than a fundamental frequency of the pulse signals.

The filter may combine the power-pulse signals so as to cancel at least a part of a signal component whose frequency is equal to a fundamental frequency of the pulse signal.

The pulse-signal generator may comprise a pulse-width modulator which generates pulse signals, whose phases are shifted from each other and whose pulse widths are modulated in accordance with the signal level of the original signal.

The pulse-signal generator may comprise a frequency modulator which generates pulse signals whose phases are shifted from each other and whose frequencies are modulated in accordance with the signal level of the original signal.

In order to accomplish the above objects, according to the second aspect of the present invention, there is provided a signal amplifying method comprising the steps of: generating a plurality of pulse signals which are out of phase; setting a ratio of an ON-period to an OFF-period of each of the plurality of pulse signals, based on a signal level of an original signal to be amplified; switching a direct-current voltage based on each of the plurality of pulse signals, thereby generating a plurality of power-pulse signals which are out of phase; and combining the plurality of generated power-pulse signals together, filtering the combined power-pulse signals, and supplying a load with the filtered signals, thereby canceling a fundamental wave component and/or a higher harmonic of each of the generated power pulse signals.

In order to accomplish the above objects, according to the third aspect of the present invention, there is provided a switching amplifier comprising: a pulse-signal generator which generates a plurality of pulse signals, whose duty ratios are modulated in accordance with an original signal to be amplified and which are out of phase with each other; a plurality of switching sections which perform a switching operation in accordance with the pulse signals, thereby generating a plurality of power-pulse signals which are out of phase with each other; and a filter which combines and filters the plurality of power-pulse signals to reproduce the original signal, and outputs the reproduced signal.

In order to accomplish the above objects, according to the fourth aspect of the present invention, there is provided a signal amplifying method comprising the steps of: generating a plurality of pulse signals whose duty ratios are modulated in accordance with an original signal to be amplified and which are out of phase with each other; switching in accordance with the pulse signals to generate a plurality of power-pulse signals which are out of phase with each other; and combining and filtering the power-pulse signals to reproduce the original signal, and outputs the reproduced signal.

BRIEF DESCRIPTION OF THE DRAWINGS

These objects and other objects and advantages of the present invention will become ore apparent upon reading of the following detailed description and the accompanying drawings in which:

FIGS. 2A to 2J are diagrams showing waveforms of signals in the switching amplifier of FIG. 1;

FIG. 8 is a block diagram showing the structure of each controller shown in FIG. 7;

FIGS. 12A to 12H are diagrams showing waveforms of signals in the switching amplifier of FIG. 11;

DETAILED DESCRIPTION OF THE PREFERRED EMBODIMENTS

Preferred embodiments of the present invention will now be described with reference to the accompanying drawings.

First Embodiment

Figure 1:
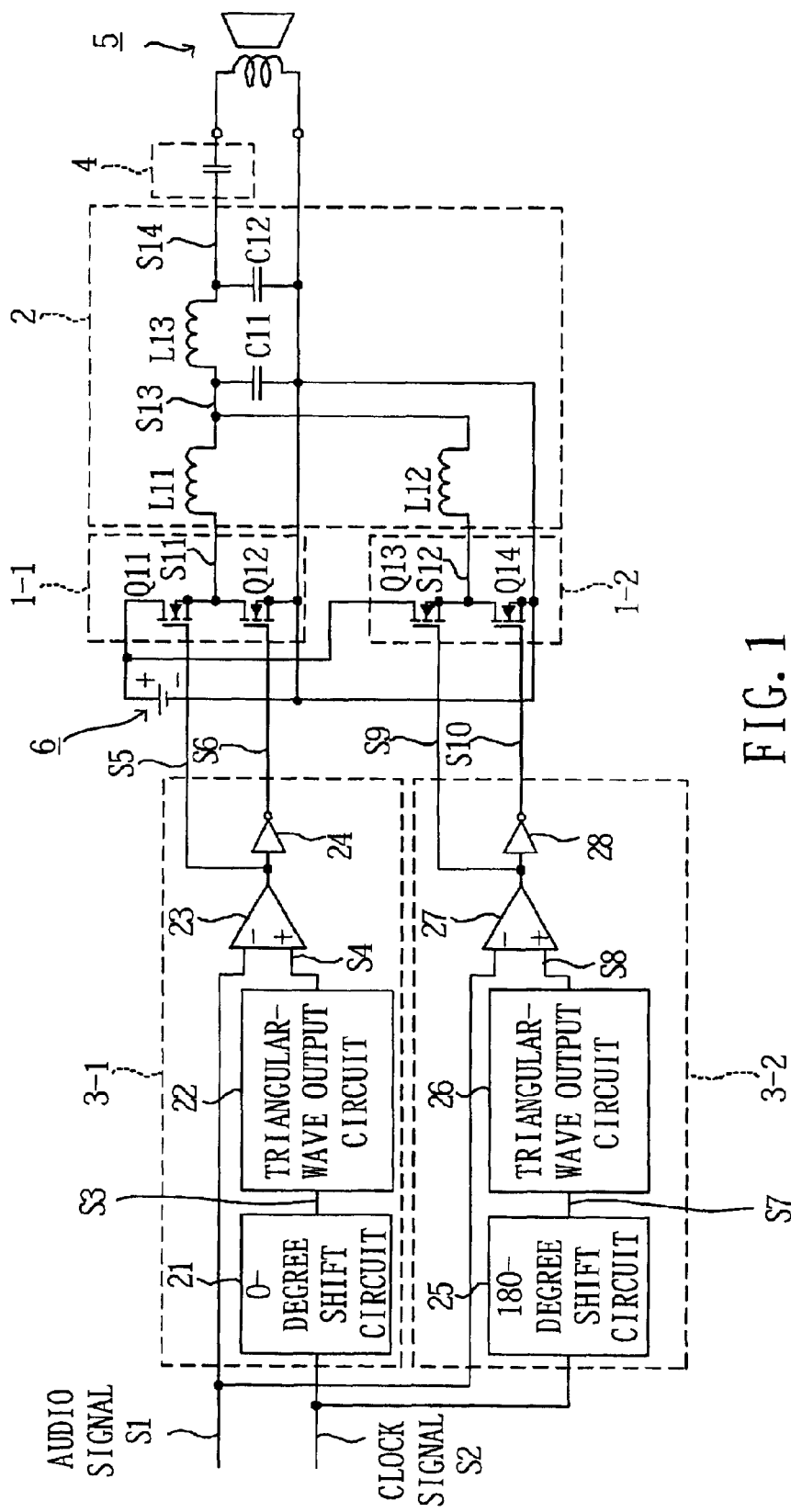
FIG. 1 is a circuit diagram showing the structure of a switching amplifier according to the first embodiment of the present invention.

A switching amplifier according to the first embodiment of the present invention is a half-bridge circuit which includes, as shown in FIG. 1, amplification sections 1—1 and 1-2, a filtering section 2, controllers 3-1 and 3-2, a capacitor 4, a speaker 5, and a direct power source 6.

The amplification section 1—1 comprises N-type MOSFETs (Metal Oxide Semiconductor Field Effect Transistors)

Q1 and Q12. The MOSFETs Q11 and Q12 respectively perform switching of a direct-current voltage from the power source 6 in accordance with the pulse signals S5 and S6 supplied from the controller 3-1, so as to output a PWM (Pulse Width Modulation) signal (a power pulse signal) at the coupling point of the MOSFETs Q11 and Q12.

The drain of the MOSFET Q11 is coupled to the positive electrode (((+))) of the power source 6, while the source thereof is coupled to the drain of the MOSFET Q12. The source of the MOSFET Q12 is coupled to the negative electrode (−) of the power source 6. The gate of the MOSFET Q11 is coupled to an output terminal of a later-described comparator 23 included in the controller 3-1, while the gate of the MOSFET Q12 is coupled to an output terminal of an inverter 24 included in the controller 3-1.

The amplification section 1-2 comprises N-type MOS-FETs Q13 and Q14. The MOSFETs Q13 and Q14 respectively perform switching of a direct-current voltage from the power source 6 in accordance with pulse signals S9 and S10 supplied from the controller 3-2, and output a power-pulse signal S12 at the coupling point of the MOSFETs Q13 and Q14.

The drain of the MOSFET Q13 is coupled to the positive electrode of the power source 6, while the source thereof is coupled to the drain of the MOSFET Q14. The source of the MOSFET Q14 is coupled to the negative electrode of the power source 6. The gate of the MOSFET Q13 is coupled to the output terminal of a comparator 27 of the controller 3-2, as will specifically be described later, while the gate of the MOSFET Q14 is coupled to the output terminal of the inverter 28 of the controller 3-2.

The filtering section 2 is a low-pass filter comprising coils L11 to L13 and capacitors C11 and C12. The filtering section 2 filters power-pulse signals S11 and S12 supplied respectively from the amplification sections 1—1 and 1-2.

The filtering section 2 comprises two stages. The first stage comprises the coils L11 and L12 and the capacitor C11. The second stage comprises the coil L13 and the capacitor C12.

One end of the coil L11 is coupled to the coupling point of the MOSFETs Q11 and Q12, while the other end thereof is coupled to one end of the coil L13. The other end of the coil L13 is coupled to one electrode of the capacitor 4. One end of the coil L12 is coupled to the coupling point of the MOSFETs Q13 and Q14, while the other end thereof is coupled to the coupling point of the coils L11 and L13.

One electrode of the capacitor C11 is coupled to one end of the coil L13 and one electrode of the capacitor C12 is coupled to the other end of the coil L13. The other electrodes of the capacitors C11 and C12 are coupled to the negative electrode of the power source 6.

The controller 3-1 comprises a 0-degree shift circuit 21, a triangular-wave output circuit 22, a comparator 23 and an inverter 24. The controller 3-1 is a PWM (Pulse Width Modulation) circuit which performs a Pulse Width Modulation on a clock signal S2 in accordance with a sound signal S1.

A clock signal S2, having 50% duty ratio, is supplied to an input terminal of the 0-degree shift circuit 21. The 0-degree shift circuit 21 generates a clock signal S3 from the clock signal S2 by shifting the phase of the clock signal S2 by 0 degree, and supplies it to the triangular-wave output circuit 22. The 0-degree shift circuit 21 comprises, for example, a signal wire with small delay.

The triangular-wave output circuit 22 integrates the clock signal S3 to generate a triangular-wave signal S4, and supplies one input terminal (((+))) of the comparator 23 with the generated signal S4.

The comparator 23 compares the signal level of an audio signal S1 supplied to the other input terminal (−) thereof with the signal level of the triangular-wave signal S4, and outputs a pulse signal S5 whose signal level becomes high when the triangular-wave signal S4 has higher signal level than that of the audio signal S1. The signal level of the pulse signal S5 becomes low when the triangular-wave signal S4 has lower signal level than that of the audio signal S1. The pulse width of the clock signal S5 vary in accordance with the signal level of the audio signal S1. Thus pulse signal S5 is supplied to the gate of the MOSFET Q11 and the input terminal of the inverter 24.

The inverter 24 inverts the signal level of the pulse signal S5 generated by the comparator 23 so as to generate a pulse signal S6. The pulse signal S6 is supplied to the gate of the MOSFET Q12.

The controller 3-2 comprises a 180-degree shift circuit 25, a triangular-wave output circuit 26, a comparator 27 and an inverter 28.

The clock signal S2 is supplied to the 180-degree shift circuit 25 which generates a clock signal S7 by shifting the phase of the clock signal S2 by 180 degrees. Generated clock signal S7 is supplied to the triangular-output circuit 26.

The triangular-output circuit 26 integrates the supplied clock signal S7 so as to generate a triangular-wave signal S8, and supplies to one input terminal (((+))) of the comparator 27 with the triangular-wave signal S8.

The comparator 27 compares the signal level of the audio signal S1 supplied to the other input terminal (−) of the comparator 27, with the signal level of the triangular-wave signal S8. Thereby, the comparator 27 generates a pulse signal S9 whose pulse width has been modulated in accordance with the audio signal S1. Generated pulse signal S9 is supplied to the gate of the MOSFET Q13 and the input terminal of the inverter 28.

The inverter 28 inverts the pulse signal S9 supplied from the comparator 27 so as to generate a pulse signal S10. The pulse signal S10 is supplied to the gate of the MOSFET Q14.

One electrode of the capacitor 4 is coupled to the coupling point of the coil L13 and capacitor C12 as described before, and the other electrode of the capacitor 4 is coupled to one input terminal of the speaker 5. The capacitor 4 holds an electric charge when the MOSFETs Q11 and Q13 are in ON state and the MOSFETs Q12 and Q14 are in OFF state. Then the capacitor 4 releases the charge when the MOSFETs Q12 and Q14 are in ON state and the MOSFETs Q11 and Q13 are in OFF state.

One input terminal of the speaker 5 is coupled to the other end of the capacitor 4 as described before, and the other input terminal thereof is coupled to the negative electrode of the power source 6. The speaker 5 outputs a sound signal based on the audio signal S14 supplied from the filtering section 2.

The power source 6 applies a direct-current positive voltage to the drains of the MOSFET Q11 and Q13, and negative voltage to the sources of the MOSFET Q12 and Q14, and so on.

Operations of the switching amplifier according to this embodiment will be explained with reference to the drawings.

FIGS. 2A to 2J respectively show the waveforms of the audio signal S1, the clock signal S2, the clock signal S3, the triangular-wave signal S4, the pulse signal S5, the pulse signal S6, the clock signal S7, the triangular-wave signal S8, the pulse signal S9 and the pulse signal S10 shown in FIG. 1.

Supplied to the controller 3-1 are the audio signal S1 of FIG. 2A and the clock signal of FIG. 2B. The 0-degree shift circuit 21 shifts the phase of the clock signal S2 by 0 degree, so as to generate the clock signal S3 shown in FIG. 2C. The clock signal S3 is supplied to the triangular-wave output circuit 22.

The triangular-wave output circuit 22 integrates the clock signal S3 so as to generate the triangular-wave signal S4 shown in FIG. 2D, and supplies the comparator 23 with the generated triangular-wave signal S4.

The comparator 23 compares the signal level of the audio signal S1 and the signal level of the triangular-wave signal S4 as shown in FIG. 2D. As shown in FIGS. 2D and 2E, the comparator 23 generates the pulse signal S5 at a low level, if the signal level of the audio signal S1 is greater than the signal level of the triangular-wave signal S4. On the contrary, the comparator 23 generates the pulse signal S5 at a high level, if the signal level of the audio signal S1 is smaller than the signal level of the triangular-wave signal S4.

The pulse signal S5 is supplied to the gate of the MOSFET Q11 and the input terminal of the inverter 24.

The inverter 24 inverts the pulse signal S5 so as to generate the pulse signal S6 of FIG. 2F. The pulse signal S6 is supplied to the gate of the MOSFET Q12.

The audio signal S1 and the clock signal S2 are supplied also to the controller 3-2 shown in FIG. 1.

The 180-degree shift circuit 25 shifts the phase of the clock signal S2 by 180 degrees, so as to generate the clock signal S7 of FIG. 2G. Then the 180-degree shift circuit 25 supplies the clock signal S7 to the triangular-wave output circuit 26.

The triangular-wave output circuit 26 integrates the clock signal S7 so as to generate the triangular-wave signal S8. Then the triangular-wave output circuit 26 supplies the triangular-wave signal S8 to the comparator 27.

The comparator 27 compares the signal level of the audio signal S1 with the signal level of the triangular-wave signal S8 as shown in FIG. 2H, and generates the pulse signal S9 as shown in FIGS. 2H and 2I. The comparator 27 supplies the pulse signal S9 to the gate of the MOSFET Q13 and the input terminal of the inverter 28.

The inverter 28 inverts the signal level of the pulse signal S9 so as to generate the pulse signal S10 shown in FIG. 2J. The pulse signal S10 is supplied to the gate of the MOSFET Q14.

The MOSFETs Q11 and Q12 of the amplification section 1—1 are in ON state when the pulse signals S5 and S6 are at a high level and in OFF state when the pulse signals S5 and S6 are at a low level. The MOSFETs Q11 and Q12 perform switching operation in accordance with the pulse signals S5 and S6, and output the power-pulse signal S11 whose pulse-width is modulated in accordance with the PWM pulse signals S5 and S6. Generated power-pulse signal S11 is supplied to the coil L11 of the filtering section 2.

The MOSFETs Q13 and Q14 of the amplifier 1-2 turn ON when the pulse signals S9 and S10 are at a high level and turn OFF when the pulse signals S9 and S10 are at a low level. The MOSFETs Q11 and Q12 perform switching operation, and output the power-pulse signal S12 whose pulse-width is modulated in accordance with the PWM pulse signals S9 and S10. Generated power-pulse signal S12 is supplied to the coil L12 of the filtering section 2.

Then the power-pulse signal S11 and the power-pulse signal S12 pass through the coils L11 and L12, the filtering section 2 synthesizes (combines) the power-pulse signals S11 and S12.

FIGS. 3A to 3D respectively show waveforms of a power-pulse signal S11, a power-pulse signal S12, a synthesized signal S13 of the power-pulse signals S11 and S12, and an audio output from the filtering section 2.

Figure 3A:
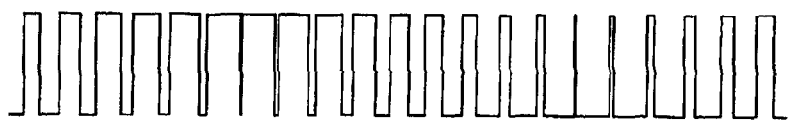
FIGS. 3A to 3D are diagrams showing waveforms of signals in the switching amplifier of FIG. 1.
Figure 3B:
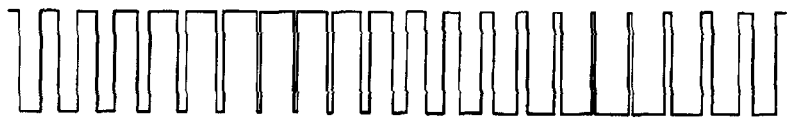
Figure 3C:
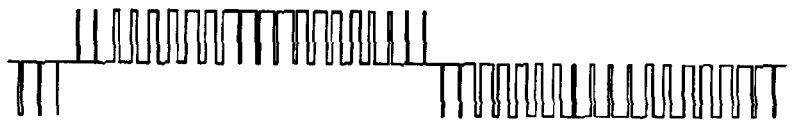
Figure 3D:
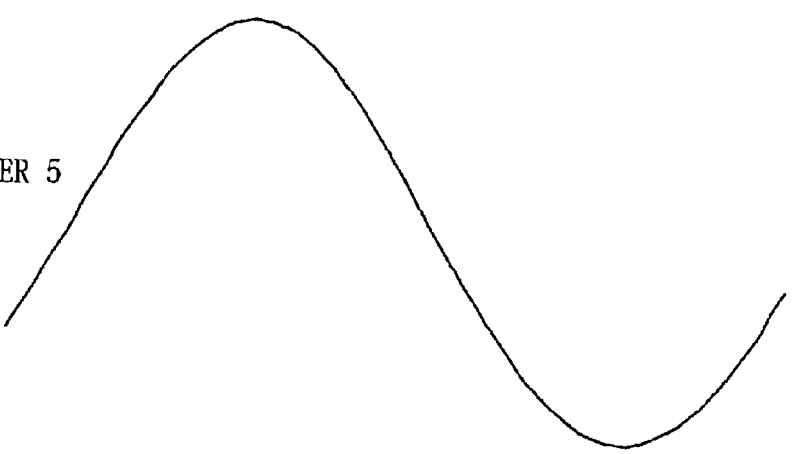

The power-pulse signals S11 and S12 shown in FIGS. 3A and 3B, pass through the coils L11 and L12, respectively, and are synthesized together resulting in a synthesized signal S13 shown in FIG. 3C. The synthesized signal S13 is filtered with a low-pass filter, the audio signal shown in FIG. 3D is reproduced with high fidelity.

FIGS. 4A to 4D respectively show enlarged waveforms of the power-pulse signals S11 and S12, the synthesized signal S13 and the audio signal S14.

Figure 4A:
FIGS. 4A to 4D are diagrams showing enlarged waveforms of signals shown in FIGS. 3A to 3D.
Figure 4B:
Figure 4C:

The phase difference between the power-pulse signals S11 and S12 is a 180 degree as shown in FIGS. 4A and 4B. Therefore, the fundamental wave components of the power-pulse signal S11 and the power pulse signal S12 are canceled with each other by synthesizing the two power-pulse signals S11 and S12. The fundamental frequency of the synthesized signal S13 is twice as much as those of the power-pulse signals S11 and S12 as shown in FIGS. 4A to 4C.

Cancellation of the fundamental frequency components of the power-pulse signals S11 and S12 is explained with the equations in more detailed.

Figure 5:
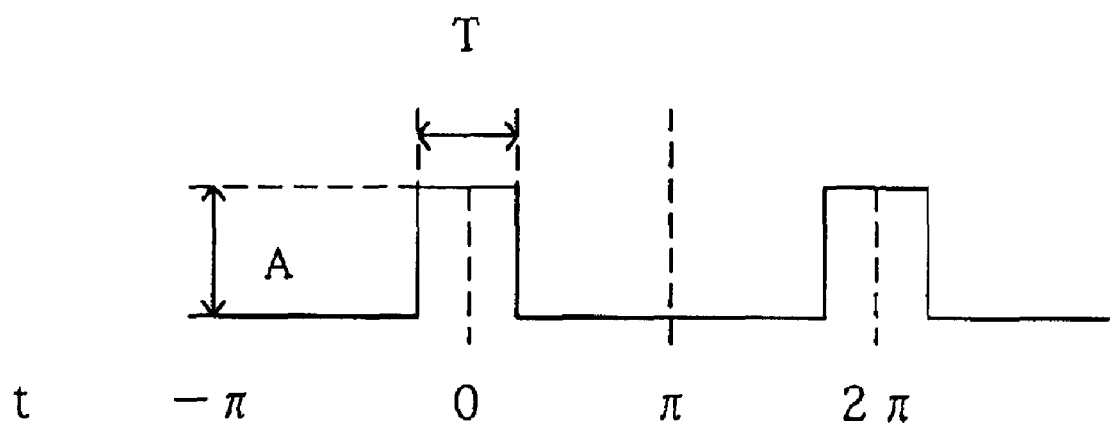
FIG. 5 is a diagram showing a waveform of a signal output from the switching sections of FIG. 1.

For easy understanding, it is assumed that the origin "0" of the time scale is set at the center point of a pulse, an amplitude of a pulse is "A", and a pulse width is "T" of the power pulse signal S11 as shown in FIG. 5. The Fourier expansion of the power-pulse signal S11 can be expressed by Equation 1.

$$V_1 = \frac{T \cdot A}{2\pi} + \frac{2A}{\pi} \cdot \sum_{n=1}^{\infty} \left( \frac{1}{n} \cdot \sin\frac{n \cdot T}{2} \cdot \cos n\omega t \right)$$ Equation 1

The Fourier expansion of the power-pulse signal S12 can be expressed in same way except the phase difference of 180 degree.

If the two power-pulse signals S11 and S12 are synthesized together, the synthesized signal of the two is expressed by Equation 2.

$$V_2 = \frac{\frac{T \cdot A}{2\pi} + \frac{2A}{\pi} \cdot \sum_{n=1}^{\infty} \left( \frac{1}{n} \cdot \sin\frac{n \cdot T}{2} \cdot \cos n\omega t \right) + \frac{T \cdot A}{2\pi} + \frac{2A}{\pi} \cdot \sum_{n=1}^{\infty} \left( \frac{1}{n} \cdot \sin\frac{n \cdot T}{2} \cdot \cos n(\omega t - \pi) \right)}{2}$$

$$= \frac{T \cdot A}{2\pi} + \frac{2A}{\pi} \cdot \sum_{n=1}^{\infty} \left( \frac{1}{2n} \cdot \sin\frac{2n \cdot T}{2} \cdot \cos 2n\omega t \right)$$

Equation 2

As can be understood from Equation 2, the fundamental frequency components and odd number harmonics of the fundamental frequency components of the power-pulse signals S11 and S12 are canceled out with each the odd number, and eliminated from the synthesized signal S13.

Figure 6:
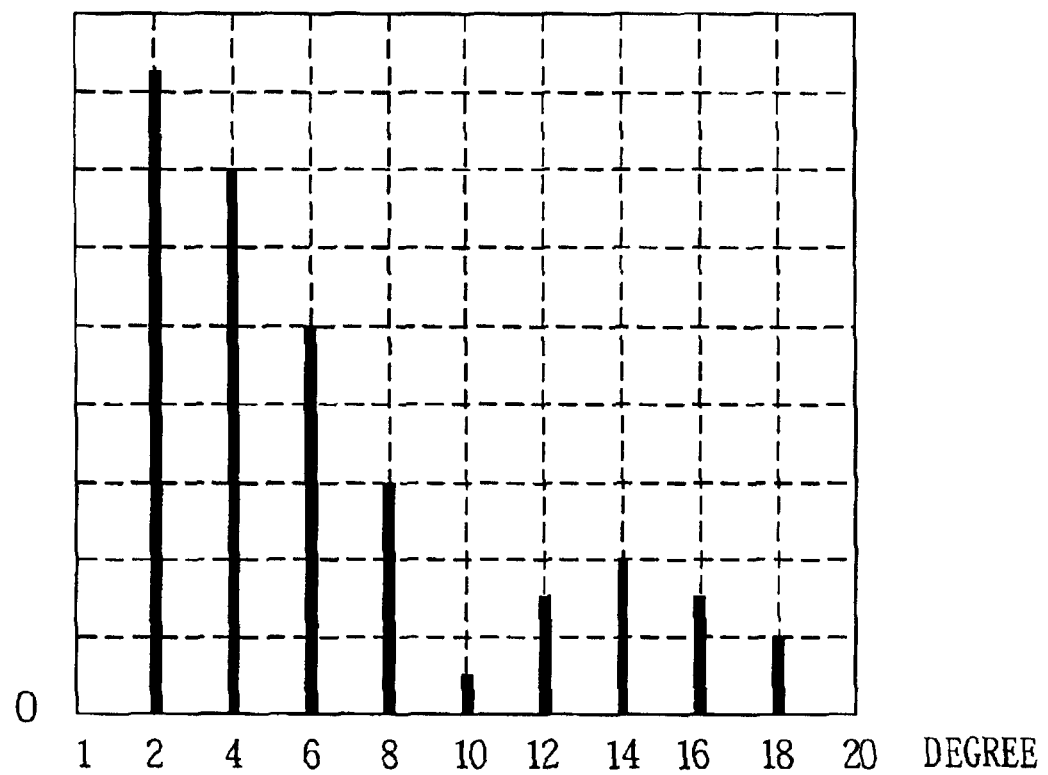
FIG. 6 is an explanatory diagram showing intensity of frequency components included in a synthesized power-pulse signal in the switching amplifier shown in FIG. 1.

The intensity of the frequency components included in the synthesized signal S13 are shown in FIG. 6. In FIG. 6, the vertical axis represents intensity and the horizontal axis represents degree (factor) in Equation 2.

As expressed in FIG. 6, the fundamental wave component (1 degree) of the power-pulse signals S11 and S12 is eliminated from the synthesized signal S13. The odd number harmonics of the fundamental wave component are also eliminated from the synthesized signal S13.

Figure 4D:

Return to FIG. 1, the filtering section 2 filters the synthesized signal S13 shown in FIGS. 3C and 4C to attenuate the components with high frequencies which are higher than that of the clock signal S2 and passes only the audio frequency components whose frequencies are relatively low and shown in FIGS. 3D and 4D.

The filtering section 2 supplies the speaker 5 with the audio signal S14 shown in FIGS. 3D and 4D. Based on the audio signal S14, the speaker 5 outputs the sound signal.

The switching amplifier according to this embodiment has three advantages as follows:

(1) The power-pulse signals S11 and S12 have a 180-degree phase difference each other. Therefore, if the power-pulse signals S11 and S12 are synthesized with each other by the filtering section 2, the fundamental wave components of the power-pulse signals S11 and S12 are canceled with each other. For example, if the switching frequencies of the MOSFETs Q11 to Q14 are 2 MHz (in other words, the frequency of the clock signal S2 is 2 MHz), the 2 MHz fundamental wave components are canceled, and only higher harmonic components whose frequencies are equal to or grater than 4 MHz which is two times as much as that of the 2 MHz fundamental wave, remains in the synthesized signal S13. Thus, it is enough that the filtering section 2 cut off only the frequency components equal to or greater than 4 MHz. So, the structure of the filtering section 2 can be simplified compared with the filter used in the conventional switching amplifier. Further the higher harmonic components have relatively small energy. The filtering section 2 can be further simplified.

(2) Assuming that a cut-off frequency of a filtering section 2 is equal to that of a filter of a conventional switching amplifier, the switching frequency of the switching devices of this embodiment can be ½ times as much as that of the switching devices of the conventional switching amplifier. As the switching frequency is reduced, inexpensive MOSFETs whose switching speed is relatively low can be used as the switching devices, thus the manufacturing cost of a switching amplifier can be reduced.

(3) If the switching frequency is ½ times as much as that of the conventional switching amplifier as explained above, the effect of the switching to the distortion rate of the output signal can also be ½ times as much as that of the conventional switching amplifier. More specifically, for example, the switching period (switching cycle) is 0.5 micro second when the switching frequency is 2 MHz. Therefore, if the switching time of an FET be longer by 1ns, it corresponds to 0.2% of the switching period, resulting in 0.2% effect on the output waveform. On the contrary, when the switching frequency is 1 MHz and the period is 1 maicro second, if the switching period be longer by ins, resulting in 0.1% effect on the period of the output waveform.

The present invention is not limited to the above embodiment. For example, the controlling method of the MOSFETs Q11 to Q14 may be a frequency modulation method instead of the PWM method.

Figure 15:
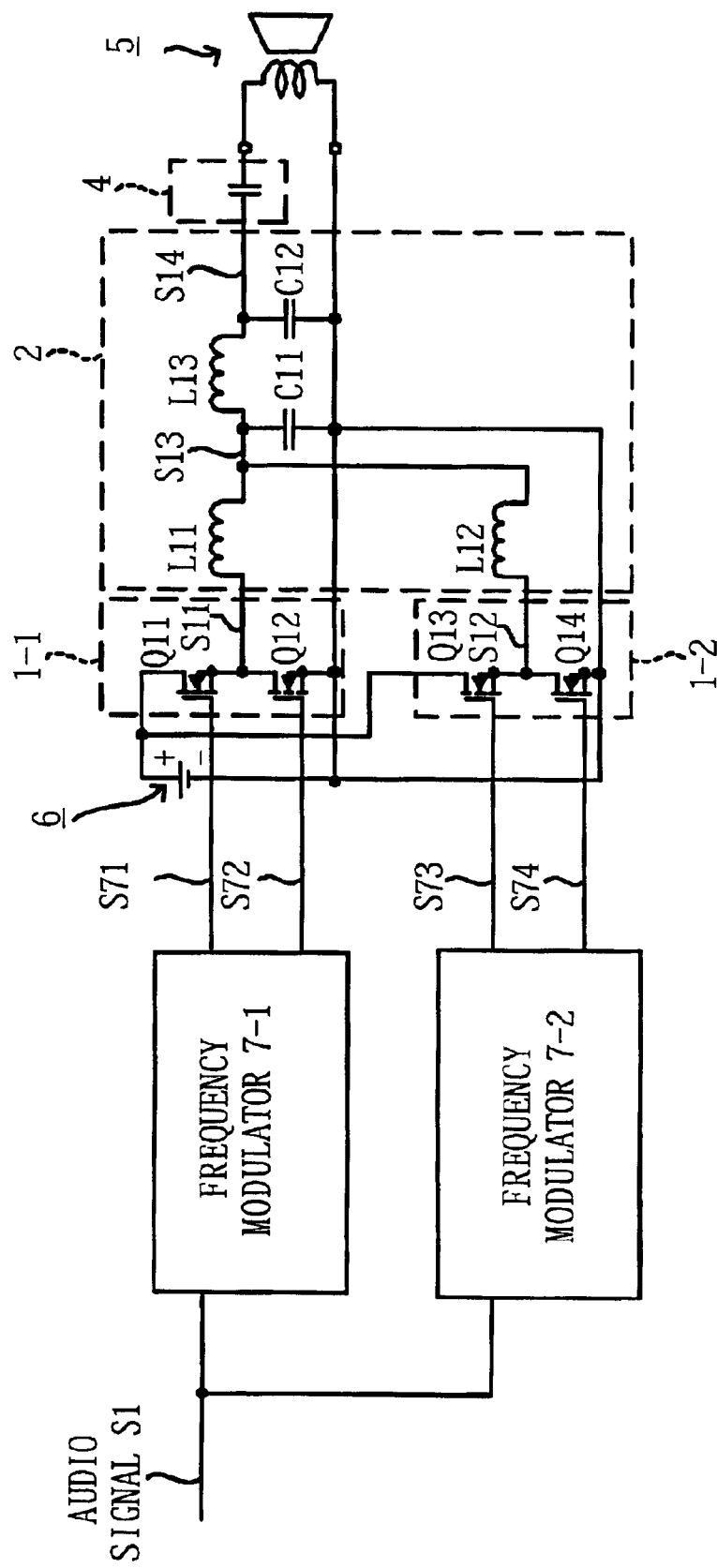
FIG. 15 is a circuit diagram showing an example of structure of a frequency modulation (FM) type switching amplifier.

A switching amplifier as shown in FIG. 15 has controllers 3-1 and 3-2 that modulate a frequency of a carrier signal in accordance with an audio signal. The same elemental components as those shown in FIG. 1 are denoted by the same reference numerals.

Second Embodiment

In the above-described embodiment, the switching amplifier includes two amplification sections. However, in the case where the switching frequency of the amplification sections needs to be further reduced than the case of the first embodiment, the switching amplifier may have four amplification sections and four controllers.

Figure 7:
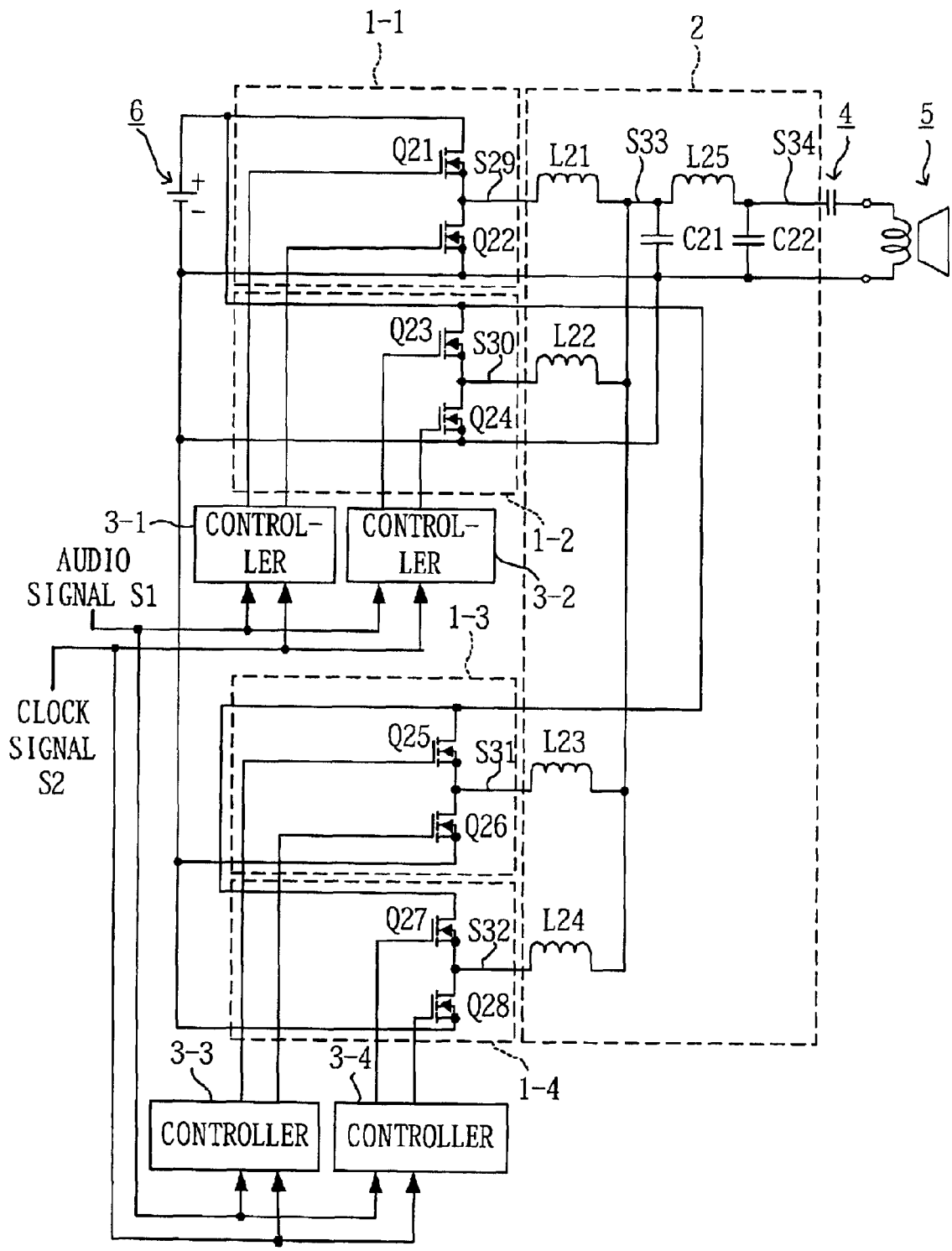
FIG. 7 is a circuit diagram showing a switching amplifier according to the second embodiment of the present invention.
Figure 9A:
FIGS. 9A to 9F are diagrams showing waveforms of signals in the switching amplifier of FIG. 7.
Figure 9B:
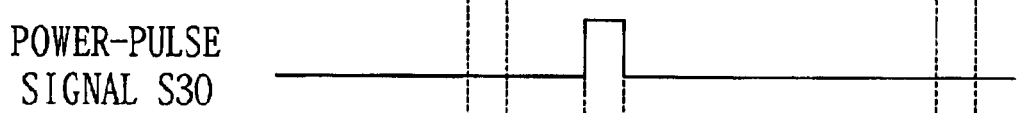
Figure 9C:
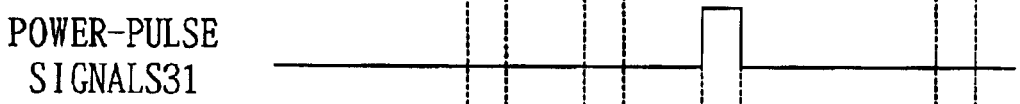
Figure 9D:
Figure 9E:
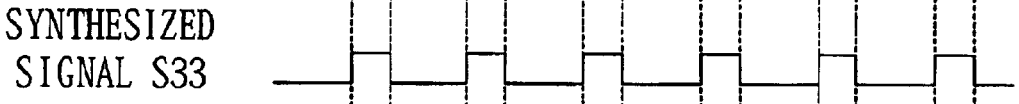
Figure 9F:
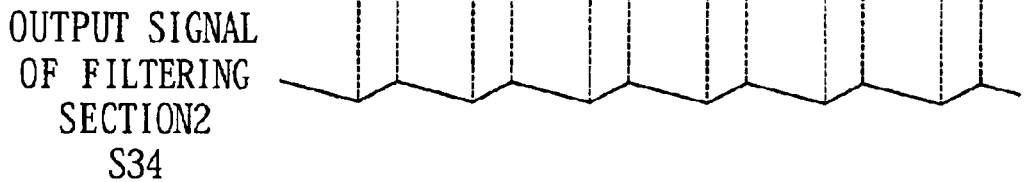

A switching amplifier having four controllers and four amplification sections according to the second embodiment of the present invention will now be explained with reference to FIG. 7.

The switching amplifier of this embodiment comprises four amplification sections 1—1 to 1-4, the filtering section 2, four controllers 3-1 to 3-4, the capacitor 4, the speaker 5 and the power source 6.

The amplification section 1—1 comprises N-type MOSFETs Q21 and Q22. The drain of the MOSFET Q21 is coupled to the positive electrode of the power source 6, while the source thereof is coupled to the drain of the MOSFET Q22. The source of the MOSFET Q22 is coupled to the negative electrode of the power source 6. The gate of the MOSFET Q21 is coupled to an output terminal of a comparator 33 of the controller 3-1, while the gate of the MOSFET Q22 is coupled to an output terminal of an inverter 34 of the controller 3-1.

The amplification section 1-2 comprises N-type MOSFETs Q23 and Q24. The drain of the MOSFET Q23 is coupled to the positive electrode of the power source 6, while the source thereof is coupled to the drain of the MOSFET Q24. The source of the MOSFET Q24 is coupled to the negative electrode of the power source 6. The gate of the MOSFET 23 is coupled to an output terminal of a comparator 38 included in the controller 3-2 shown in FIG. 8, and the gate of the MOSFET Q24 is coupled to an output terminal of an inverter 39 included in the controller 3-2 shown in FIG. 8.

The amplification section 1-3 comprises N-type MOSFETs Q25 and Q26. The drain of the MOSFET Q25 is coupled to the positive electrode of the power source 6, while the source thereof is coupled to the drain of the MOSFET Q26. The source of the MOSFET Q26 is coupled to the negative electrode of the power source 6. The gate of the MOSFET Q24 is coupled to an output terminal of a comparator 43 of the controller 3—3 shown in FIG. 8, while the gate of the MOSFET Q26 is coupled to an output terminal of an inverter 44 of the controller 3—3 shown in FIG. 8.

The amplification section 1-4 comprises N-type MOSFETs Q27 and Q28. The drain of the MOSFET Q27 is coupled to the drain of the MOSFET 25, while the source thereof is coupled to the drain of the MOSFET Q28. The source of the MOSFET Q28 is coupled to the negative electrode of the power source 6. The gate of the MOSFET Q27 is coupled to an output terminal of a comparator 48 included in the controller 3-4 shown in FIG. 8, while the gate of the MOSFET Q28 is coupled to an output terminal of an inverter 49 included in the controller 3-4.

The filtering section 2 comprises five coils L21 to L25, and capacitors C21 and C22. One end of the coil L21 is coupled to the coupling point of the MOSFETs Q21 and Q22 while the other end thereof is coupled to one end of the coil L25. The other end of the coil L25 is coupled to one electrode of the capacitor 4. One end of the coil L22 is coupled to the coupling point of the MOSFETs Q23 and Q24, and the other end thereof is coupled to the other end of the coils L21.

One end of the coil L23 is coupled to the coupling point of the MOSFETs Q25 and Q26, while the other end thereof is coupled to the other end of the coils L21. One end of the coil L24 is coupled to the coupling point of the MOSFET Q27 and Q28, while the other end thereof is coupled to the other end of the coils L21.

One electrode of the capacitor C21 is coupled to one end of the coil L25 and one electrode of the capacitor C22 is coupled to the other end of the coil L25. The other electrodes of the capacitors C21 and C22 are coupled to the negative electrode of the power source 6.

The structures of the controllers 3-1 to 3-4 are shown in FIG. 8.

The controller 3-1 comprises a 0-degree shift circuit 31, a triangular-wave output circuit 32, the comparator 33 and the inverter 34.

The controller 3-2 comprises a 90-degree shift circuit 36, a triangular-wave output circuit 37, the comparator 38 and the inverter 39.

The 90-degree shift circuit 36 shifts a phase of a clock signal S2 by 90 degrees.

The controller 3—3 comprises a 180-degree shift circuit 41, a triangular-wave output circuit 42, the comparator 43 and the inverter 44.

The controller 3-4 comprises a 270-degree shift circuit 46, a triangular-wave output circuit 47, the comparator 48 and the inverter 49.

The 270-degree shift circuit 46 shifts the phase of the clock signal S2 by 270 degree.

Operations of the switching amplifier according to this embodiment will be explained with reference to FIGS. 7 to 10.

The controller 3-1 supplies the gate of the MOSFET Q21 with the pulse signal S21, and supplies the gate of the MOSFET Q22 with the pulse signal S22.

In the controller 3-1, the 0-degree shift circuit 31 outputs the clock signal S2 as it is, and supplies the clock signal to the triangular-wave output circuit 32. The triangular-wave output circuit 32 generates a triangular-wave signal by integrating the clock signal, and supplies it to the comparator 33. The comparator 33 compares the signal level of the audio signal S1 with the signal level of the triangular-wave signal, and generates a pulse signal S21 whose pulse width has been modulated. The comparator 33 supplies the gate of the MOSFET Q21 with the pulse signal S21. The inverter 34 inverts the pulse signal S21, and outputs a pulse signal S22 to the gate of the MOSFET Q22.

In the controller 3-2, the 90-degree shift circuit 36 shifts the phase of the clock signal S2 by 90 degrees, and supplies the sifted clock signal to the triangular-wave output circuit 37. The triangular-wave output circuit 37 generates a triangular-wave signal by integrating the sifted clock signal, and supplies the comparator 38 with the generated triangular-wave signal. The comparator 38 compares the signal level of the audio signal S1 with the signal level of the triangular-wave signal, and generates a pulse signal S23 whose phase has been shifted by 90 degree from that of the pulse signal S21 and whose pulse width has been modulated. The comparator 38 supplies the gate of the MOSFET Q23 with the pulse signal S23. The inverter 39 inverts the pulse signal S23, and outputs a pulse signal S24 to the gate of the MOSFET Q24.

In the same manner, in the controller 3—3, the 180-degree shift circuit 41, the triangular-wave output circuit 42, and the comparator 43 generate, from the audio signal S1 and clock signal S2, a pulse signal S25 whose phase has been shifted by 180 degree from that of the pulse signal S21 and whose pulse width has been modulated. The comparator 43 supplies the gate of the MOSFET Q25 with the pulse signal S25. The inverter 44 inverts the pulse signal S25, and outputs a pulse signal S26 to the gate of the MOSFET Q26.

In the same manner, in the controller 3-4, the 270-degree shift circuit 46, the triangular-wave output circuit 47, and the comparator 48 generate, from the audio signal S1 and clock signal S2, a pulse signal S27 whose phase has been shifted by 270 degree from that of the pulse signal S21 and whose pulse width has been modulated. The inverter 49 inverts the pulse signal S27, and outputs a pulse signal S28. The pulse signals S27 and S28 are supplied to the gates of the MOSFETs Q27 and Q28, respectively.

The MOSFETs Q21 and Q22 perform switching operation in accordance with the pulse signals S21 and S22, and output a power-pulse signal S29 whose pulse-width is modulated in accordance with the pulse signals S21 and S22.

In the same manner, the MOSFETs Q23 and Q24, Q25 and Q26, and Q27 and Q28 perform switching operation in accordance with the pulse signals S23 and S24, S25 and S26, and S27 and S28, and output the power-pulse signal S30, S31, and S32, respectively.

In this manner, the power-pulse signals S29, S30, S31, and S32, whose phases are shifted by 90 degree one by one as shown in FIGS. 9A to 9D, are generated.

The power pulse signals S29, S30, S31, and S32 are supplied to the filtering section 2. In the filtering section 2, the power pulse signals S29, S30, S31, and S32 are synthesized with each other to generate a synthesized signal S33 shown in FIG. 9E. The synthesized signal S33 is filtered by the filtering section 2 so as to reproduce the audio signal S34 shown in FIG. 9F. The audio signal S34 is supplied to the speaker 5 through the capacitor 4.

Figure 10:
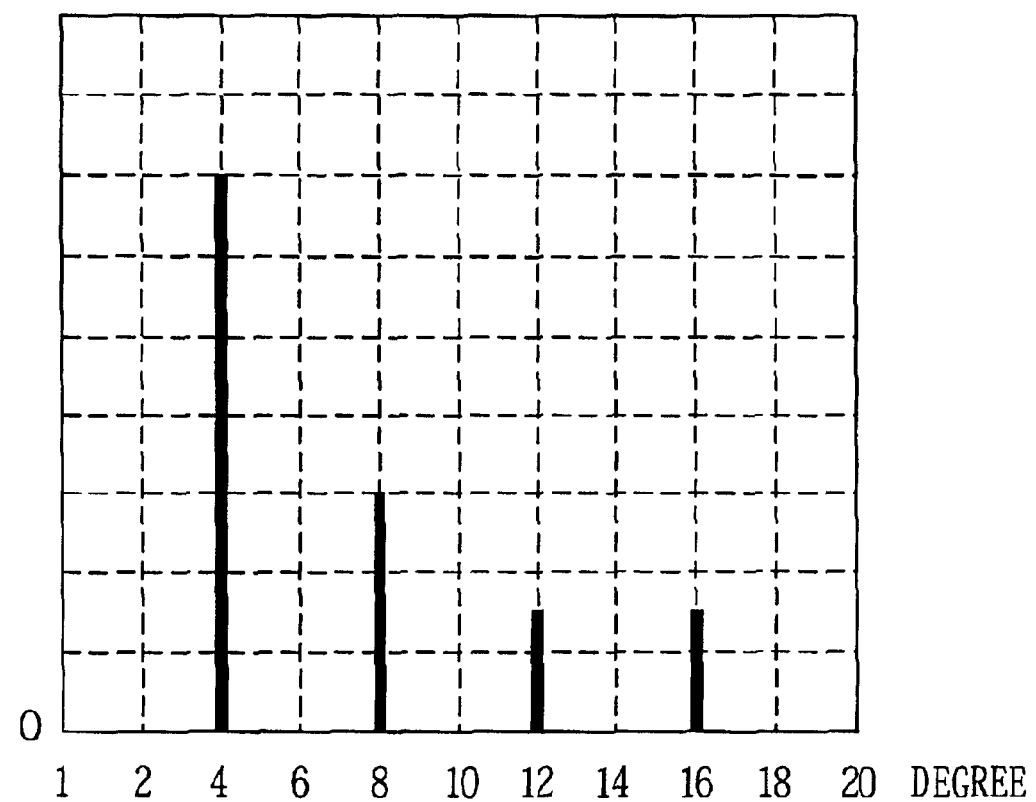
FIG. 10 is an explanatory diagram showing intensity of each frequency component included in a synthesized power-pulse signal in the switching amplifier of FIG. 7.

The intensity of the frequency components included in the synthesized signal S33 are shown in FIG. 10. When the power-pulse signals S29 to S32 are synthesized together, the frequency components except 4.n (n=1,2,3 . . . ) order higher harmonics components of the power-pulse signals S29 to S32 are erased or canceled with each other. As a result of this, only 4th, 8th, 12th, . . . higher harmonic components remain in the synthesized signal S33 as shown in FIG. 10

The switching amplifier according to this embodiment has the following advantages. The switching signals included in the synthesized signal are only higher harmonic components whose frequencies are 4.n (n=1, 2, 3, . . . ) times as much as that of the fundamental wave component. So the switching frequency of each of the amplification sections 1—1 to 1-4 can be ¼ as much as that of the switching frequency of a conventional switching amplifier. Or, the cut-off frequency of the filtering section 2 can be four times as much as that of a filter of a conventional switching amplifier. So, the structure of the filtering section 2 can be simplified compared with the filter used in the conventional switching amplifier. Further the higher harmonic components have relatively small energy. The filtering section 2 can be further simplified.

Third Embodiment

To obtain a large output from a relatively-low source voltage, a BTL (Balanced Transformer Less) circuit may be employed in the switching amplifier.

Figure 11:
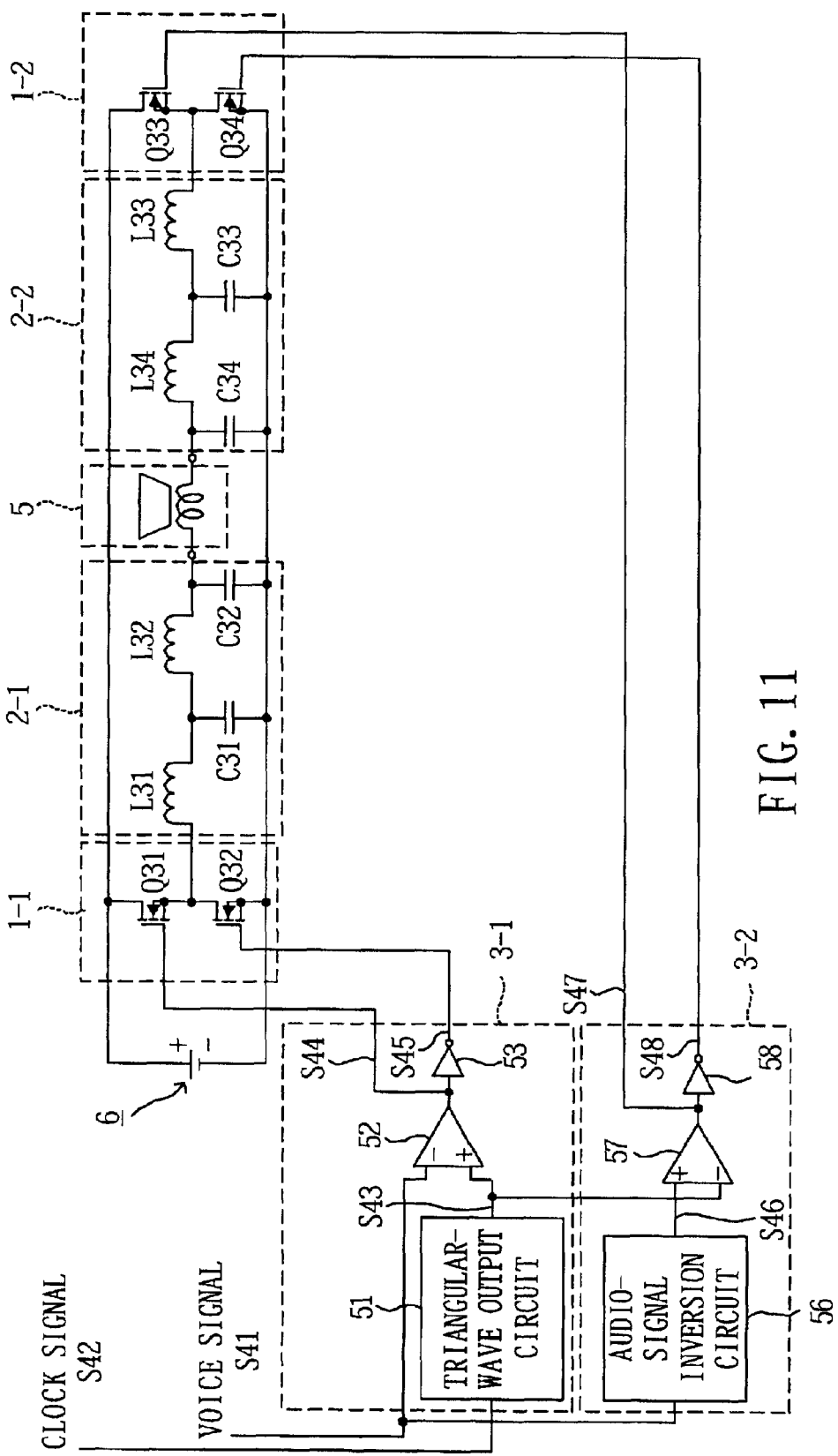
FIG. 11 is a circuit diagram showing the structure of a switching amplifier according to the third embodiment of the present invention.

An example of a switching amplifier having a BTL circuit is shown in FIG. 11. The switching amplifier comprises amplification sections 1—1 and 1-2, filtering sections 2-1 and 2—2, controllers 3-1 and 3-2, a speaker 5 and a power source 6. In FIG. 11, the same elemental components as those shown in FIG. 1 are denoted by the same reference symbols.

By this structure, a full-bridge circuit can be realized. In this full-bridge circuit, the speaker 5 is coupled between output terminals of the respective amplification sections 1—1 and 1-2. Signals whose phases are 180 degree out of phase with each other are supplied to both input terminals of the speaker 5, thereby work as a BTL circuit.

The amplification section 1—1 comprises N-type MOSFETs Q31 and Q32. The drain of the MOSFET Q31 is coupled to the positive electrode of the power source 6, while the source thereof is coupled to the drain of the MOSFET Q32. The source of the MOSFET Q32 is coupled to the negative electrode of the power source 6. The gate of the MOSFET Q31 is coupled to an output terminal of a comparator 52, while the gate of the MOSFET Q32 is coupled to an output terminal of an inverter 53.

The amplification section 1-2 comprises N-type MOSFETs Q33 and Q34. The drain of the MOSFET Q33 is coupled to the positive electrode of the power source 6, while the source thereof is coupled to the drain of the MOSFET Q34. The source of the MOSFET Q34 is coupled to the negative electrode of the power source 6. The gate of the MOSFET Q33 is coupled to an output terminal of a comparator 57, while the gate of the MOSFET Q34 is coupled to an output terminal of an inverter 58.

The filtering section 2-1 comprises coils L31 and L32 and capacitors C31 and C32. One end of the coil L31 is coupled to a coupling point of the MOSFETs Q31 and Q32 and the other end of the coil L31 is coupled to one end of the coil L32. The other end of the coil L32 is coupled to one input terminal of the speaker 5. One electrode of the capacitor C31 is coupled to the other end of the coil L31 while the other electrode thereof is coupled to the negative electrode of the power source 6. One electrode of the capacitor C32 is coupled to the other end of the coil L32 while the other electrode thereof is coupled to the negative electrode of the power source 6.

The filtering section 2—2 comprises coils L33 and L34, and capacitors C33 and C34. One end of the coil L33 is coupled to a coupling point of the MOSFETs Q33 and Q34 while the other end thereof is coupled to one end of the coil L34. The other end of the coil L34 is coupled to the other input terminal of the speaker 5. One electrode of the capacitor C33 is coupled to the other end of the coil L33 while the other electrode of the capacitor C33 is coupled to the negative electrode of the power source 6. One electrode of the capacitor C34 is coupled to the other end of the coil L34 while the other end thereof is coupled to the negative electrode of the power source 6.

The controller 3-1 comprises a triangular-wave output circuit 51, the comparator 52, and the inverter 53. The triangular-wave output circuit 51 integrates a supplied clock signal S42 so as to generate a triangular-wave signal S43, and supplies one input terminal (((+))) of the comparator 52, and one input terminal (((+))) of the comparator 57 with the generated triangular-wave signal S43. The comparator 52 compares the signal level of an audio signal S41 with the signal level of the triangular-wave signal S43, and generates a pulse signal S44. The pulse signal S44 is supplied to the gate of the MOSFET Q31 and the input terminal of the inverter 53. The inverter 53 inverts the signal level of the pulse signal S44 so as to generate a pulse signal S45. The pulse signal S45 is supplied to the gate of the MOSFET Q32.

The controller 3-2 comprises an audio-signal inversion circuit 56, the comparator 57 and the inverter 58. The audio-signal inversion circuit 56 inverts the signal level of the supplied audio signal S41 so as to generate an inverted-audio signal S46. The inverted-audio signal S46 is supplied to one end (−) of the comparator 57. The comparator 57 compares the signal level of the inverted-audio signal S46 with the signal level of a triangular-wave signal S43, and generates a pulse signal S47. Generated pulse signal S47 is supplied to the gate of the MOSFET Q33 and to an input terminal of the inverter 58. The inverter 58 inverts the signal level of the pulse signal S47, to generate a pulse signal S48. Generated pulse signal S48 is supplied to the gate of the MOSFET Q34.

The power pulse signals output from filtering sections 2-1 and 2—2 are supplied to the input terminals of the speaker 5 and combined or synthesized at the speaker 5.

Operations of the switching amplifier according to this embodiment of the present invention will be described.

FIGS. 12A to 12H respectively show the audio signal S41, the clock signal S42, the triangular-wave signal S43, the pulse signals S44 and S45, the inverted-audio signal S46, and the pulse signals S47 and S48.

The audio signal S41 shown in FIG. 12A is supplied to each of the controllers 3-1 and 3-2. Further, the clock signal S42 shown in FIG. 12B is supplied to the controller 3-1.

The comparator 52 compares the signal level of the audio signal S41 and the signal level of the triangular-wave signal S43, as shown in FIG. 12C and outputs the pulse signal shown in FIG. 12D.

The inverter 53 inverts the signal level of the pulse signal S44 so as to output the pulse signal S45 shown in FIG. 12E.

The comparator 57 compares the signal level of the inverted-audio signal S46 with the signal level of the triangular-wave signal S43, as shown in FIG. 12F, and generates a pulse signal S47 shown in FIG. 12G.

The inverter 58 inverts the pulse signal S47 supplied from the comparator 57, so as to output the pulse signal S48 shown in FIG. 12H.

The MOSFETs Q31 and Q32 perform switching operation in accordance with the signal level of the pulse signals S44 and S45 and output a power-pulse signal to the filtering section 2-1. The MOSFETs Q33 and Q34 perform a switching operation in accordance with the signal level of the pulse signals S47 and S48 and output a power-pulse signal to the filtering section 2—2.

The filtering section 2-1 filters the power pulse signal from the amplifying section 1—1 to cut off the higher harmonic frequency components in the power pulse signal and reproduce the audio signal. The filtering section 2—2 filters the power pulse signal from the amplifying section 1-2 to cut off the higher harmonic frequency components in the power pulse signal and reproduce the audio signal. The audio signal output from the filtering section 2-1 is supplied to one input terminal of the speaker 5, and the audio signal output from the filtering section 2—2 is supplied to the other input terminal of the speaker 5. At the speaker 5, the two power pulse signals are combined and the speaker 5 are driven by the difference between the two input audio signals.

According to the switching amplifier of this embodiment, the triangular-wave signal generated by the triangular-wave output circuit 51 is supplied not only to the positive input terminal of the comparator 52 of the controller 3-1, but also to the negative input terminal of the comparator 57 of the controller 3-2. Further, the audio-signal inversion circuit 56 of the controller 3-2 inverts the signal level of the audio signal S41, and supplies the negative input terminal of the comparator 57 with the inverted-audio signal S46.

There is a 180-degree phase difference between the power-pulse signal generated by the amplification section 1—1 and the power-pulse signal generated by the amplification section 1-2. Therefor, the fundamental wave components of the power-pulse signals are canceled at the speaker 5 when the power pulse signals are combined.

Fourth Embodiment

In the third embodiment, the switching amplifier employs one BTL circuit. However, when intended to improve the distortion rate of the output of switching amplifier, a plurality of BTL circuits may be employed thereto as shown in FIG. 13.

Figure 13:
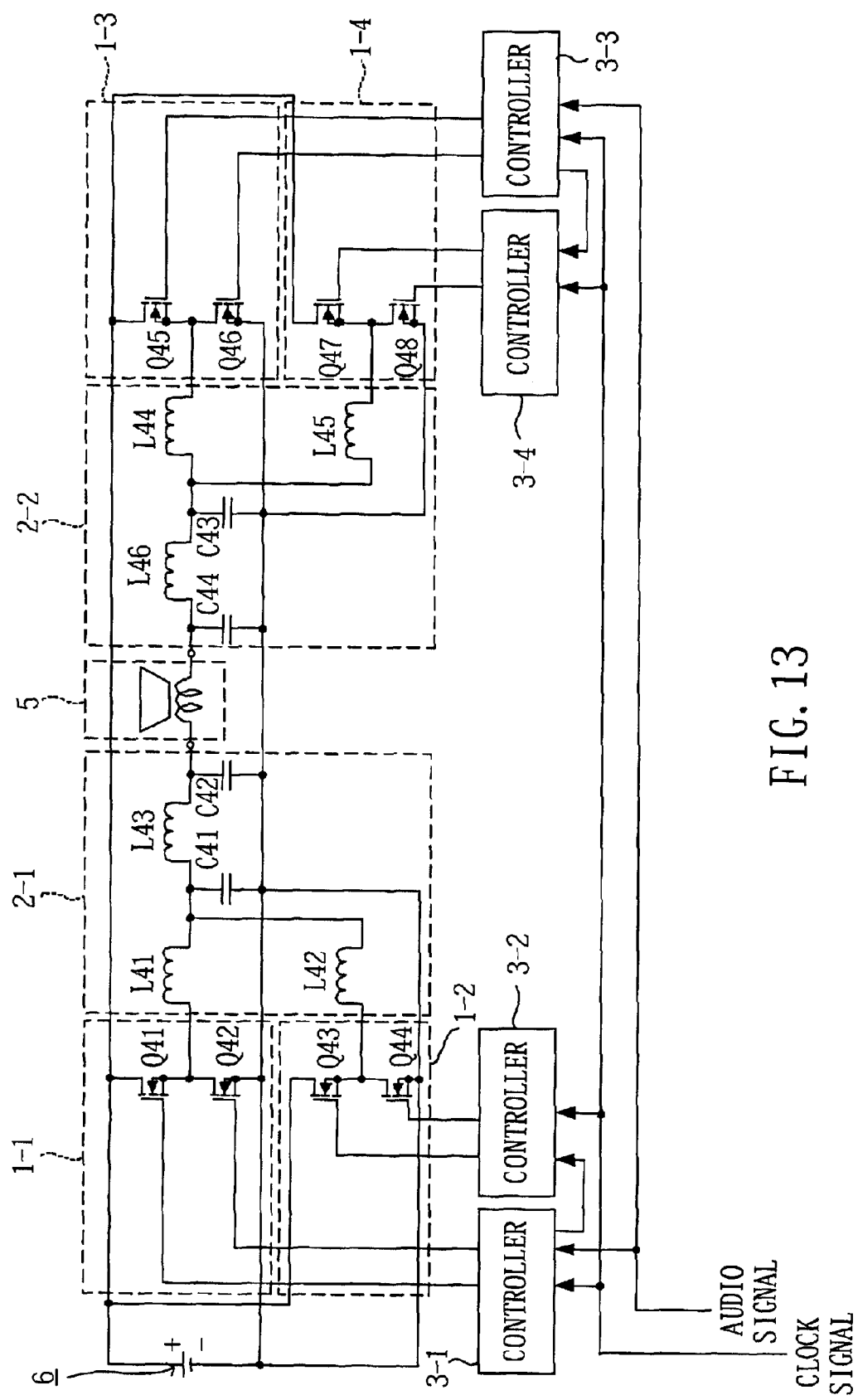
FIG. 13 is a circuit diagram showing the structure of a switching amplifier according to the fourth embodiment of the present invention.

The switching amplifier shown in FIG. 13 comprises, four amplification sections 1—1 to 1-4, the filtering sections 2-1 and 2—2, four controllers 3-1 and 3-4, the speaker 5, and the power source 6. In FIG. 13, the same elemental components as those shown in FIG. 1 are denoted by the same reference numerals.

The amplification section 1—1 comprises N-type MOSFETs Q41 and Q42. The drain of the MOSFET Q41 is coupled to the positive electrode of the power source 6, while the source thereof is coupled to the drain of the MOSFET Q42. The source of the MOSFET Q42 is coupled to the negative electrode of the power source 6. As explained later, the gate of the MOSFET Q41 is coupled to an output terminal of a comparator 63 of the controller 3-1 shown in FIG. 14, while the gate of the MOSFET Q42 is coupled to an output terminal of an inverter 64 of the controller 3-1 shown in FIG. 14.

The amplification section 1-2 comprises N-type MOSFETs Q43 and Q44. The drain of the MOSFET Q43 is coupled to the positive electrode of the power source 6 while the source thereof is coupled to the drain of the MOSFET Q44. The source of the MOSFET Q44 is coupled to the negative electrode of the power source 6. As described later, the gate of the MOSFET Q43 is coupled to an output terminal of a comparator 68 of the controller 3-2 shown in FIG. 14 while the gate of the MOSFET Q44 is coupled to an output terminal of an inverter 69 of the controller 3-2 shown in FIG. 14.

The amplification section 1-3 comprises N-type MOSFETs Q45 and Q46. The drain of the MOSFET Q45 is coupled to the drain of the MOSFET Q41, and the source thereof is coupled to the drain of the MOSFET Q46. The source of the MOSFET Q46 is coupled to the negative electrode of the power source 6. As described later, the gate of the MOSFET Q45 is coupled to an output terminal of a comparator 73 of the controller 3—3 shown in FIG. 14 while the gate of the MOSFET Q46 is coupled to an output terminal of an inverter 74 included in the controller 3—3 shown in FIG. 14.

The amplification section 1-4 comprises N-type MOSFETs Q47 and Q48. The drain of the MOSFET Q47 is coupled to the positive electrode of the power source 6 and the source of the MOSFEF Q47 is coupled to the drain of the MOSFET Q48. The source of the MOSFET Q48 is coupled the negative electrode of the power source 6. As explained later, the gate of the MOSFET Q47 is coupled to an output terminal of a comparator 78 of the controller 3-4 shown in FIG. 14, while the gate of the MOSFET Q48 is coupled to an output terminal of an inverter 79 of the controller 3-4 shown in FIG. 14.

The filtering section 2-1 comprises three coils L41 to L43 and capacitors C41 and C42. One end of the coil L41 is coupled to a coupling point of the MOSFETs Q41 and Q42 while the other end thereof is coupled to one end of the coil L43. The other end of the coil L43 is coupled to one input terminal of the speaker 5. One end of the coil L42 is coupled to the coupling point of the MOSFETs Q43 and Q44, while the other end tehreof is coupled to the other end of the coil L41.

One electrode of the capacitor C41 is coupled to one end of the coil L43 while the other end thereof is coupled to the negative electrode of the power source 6. One electrode of the capacitor C42 is coupled to the other end of the coil L43 while the other electrode thereof is coupled to the negative electrode of the power source 6.

The filtering section 2—2 comprises three coils L44 to L46, and capacitors C43 and C44. One end of the coil L44 is coupled to a coupling point of the MOSFET Q45 and Q46, while the other end thereof is coupled to one end of the coil L46. The other end of the coil L46 is coupled to the other input terminal of the speaker 5. One end of the coil L45 is coupled to a coupling point of the MOSFETs Q47 and Q48, and the other end thereof is coupled to the other end of the coils L44.

One end of the capacitor C43 is coupled to one end of the coil L46, while the other end thereof is coupled to the negative electrode of the power source 6. One end of the capacitor C44 is coupled to the other end of the coil L46, and the other end of the capacitor C44 is coupled to the negative electrode of the power source 6.

Figure 14:
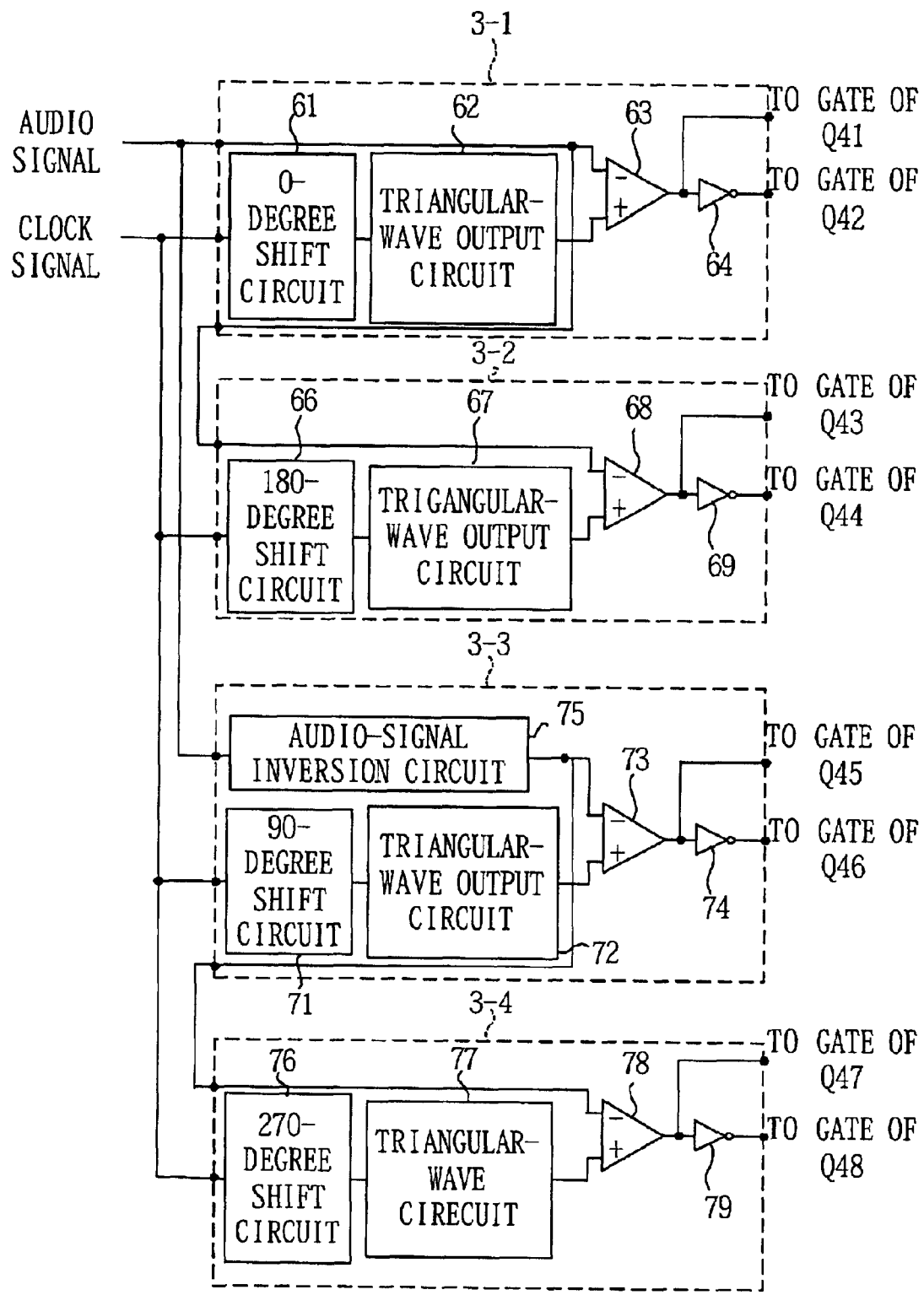
FIG. 14 is a block diagram showing the structure of each controller shown in FIG. 13.

FIG. 14 shows the structures of the respective controllers 3-1 to 3-4.

The controller 3-1 comprises a 0-degree shift circuit 61, a triangular-wave output circuit 62, a comparator 63 and the inverter 64.

The controller 3-2 comprises a 180-degree shift-circuit 66, a triangular-wave output circuit 67, the comparator 68 and the inverter 69.

The controller 3—3 comprises a 90-degree shift circuit 71, a triangular-wave output circuit 72, the comparator 73, the inverter 74 and an audio-signal inversion circuit 75.

The controller 3-4 comprises a 270-degree shift circuit 76, a triangular-wave output circuit 77, the comparator 78 and the inverter 79.

The same elemental components as those shown in FIG. 1 are denoted by the same reference numerals.

Operations of the switching amplifier according to the fourth embodiment of the present invention will be explained.

The controllers 3-1 and 3-2 output pulse signals to the amplification sections 1—1 and 1-2 so that there will be a 180-degree phase difference between a power-pulse signal output from the amplification section 1—1 and a power-pulse signal output from the amplification section 1-2. The controllers 3—3 and 3-4 output pulse signals to the amplification sections 1-3 and 1-4 so that there will be a 180-degree phase difference between a power-pulse signal output from the amplification section 1-3 and a power-pulse signal output from the amplification section 1-4.

The filtering section 2-1 synthesizes the power-pulse signal from the amplification section 1—1 and the power-pulse signal from the amplification section 1-2 so as to generate a synthesized signal. The filtering section 2—2 synthesizes the power-pulse signal of the amplification section 1-3 and the power-pulse signal of the amplification section 1-4 so as to generate a synthesized signal.

The controllers 3-1 and 3—3 output pulse signals to the amplification section 1—1 and 1-3 so that there will be a 90-degree phase difference between a power-pulse signal output from the amplification sections 1—1 and 1-3. The controllers 3-2 and 3-4 output pulse signals so that there will be a 90-degree phase difference between a power-pulse signals output from the amplification sections 1-2 and a power-pulse signals output from the amplification sections 1-4.

The filtering section 2-1 synthesizes the power-pulse signal from the amplification section 1—1 and the power-pulse signal of the amplification section 1-2 so as to generate a synthesized signal. The filtering section 2—2 synthesizes the power-pulse signal from the amplification section 1-3 and the power-pulse signal from the amplification section 1-4 so as to generate a synthesized signal.

The synthesized signals are filtered by the filtering sections 2-1 and 2—2, to cut off the higher harmonic frequency components and reproduce the audio signals. The audio signal output from the filtering section 2-1 is supplied to one input terminal of the speaker 5, and the audio signal output from the filtering section 2—2 is supplied to the other input terminal of the speaker 5. The speaker 5 are driven by the difference between the two input audio signals.

The advantage of the switching amplifier according to this embodiment is the following:

Because of the phase differences of the power-pulse signals, the fundamental frequency components of the power-pulse signals are canceled and the second higher harmonic components of the power-pulse signals are canceled, too. In addition, the distortion rate of the output of the switching amplifier can be improved.

The switching amplifier according to the fourth embodiment includes two BTL circuits. However, the number of the BTL circuits is not limited to two, and three or more BTL circuits may be employed.

In the first to fourth embodiments, controllers for controlling the duty ration (pulse width) of the clock signal in accordance with an audio signal to-be amplified are used to generate switching signals which control switching operation. The present invention is not limited to this, and other types of controllers can be used. For example, an FM (Frequency Modulation) circuits can be used as the controller. FIG. 15 represents the circuit configuration of a switching amplifier which uses frequency-modulators 7-1 and 7-2 instead of the controller 3-1 and 3-2 shown in FIG. 1. The frequency-modulator 7-1 and 7-2 modulated frequencies of the internal clock signal (not shown) in accordance with the audio signal S1. The frequency modulator 7-1 generates a frequency-modulated pulse signal S71 and a signal S72 which is an inverted signal of the signal S71. The frequency modulator 7-2 generates a frequency-modulated pulse signal S73 whose phase is shifted by 180 degree from that of the signal S71 and a signal S74 which is an inverted signal of the signal S73. The signals S71 to S74 are supplied to the gates of MOSFETs Q11 to Q14. In the same manner, the controllers 3-1 to 30-4 in the second to fourth embodiments can be replaced with the frequency modulators.

The switching devices are not limited to the above-described MOSFETs, but may be other types of the FETs, bipolar transistors, and so on.

The structures of the filtering section are not limited to the above-described structures, but any types of the low-pass or band-pass filters which can sufficiently attenuate the switching components (especially fundamental components of the clock signal) in the signal and reproduce the audio signal adequately.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2001-173071 filed on Jun. 7, 2001, and including specification, claims, drawings and summary. The disclosure of the above Japanese Patent Application is incorporated herein by reference in its entirety.

What is claimed is:

1. A switching amplifier generating pulse signals, setting a duty ratio of each of the pulse signals in accordance with a signal level of an original signal to be amplified, switching a direct-current voltage in accordance with each of the pulse signals, and filtering the pulse signals, thereby amplifying the original signal and supplying a load with the amplified signal, said amplifier comprising:

a pulse-signal generator which generates the pulse signals, each of which has a duty ratio corresponding to the signal level of the original signal and is out of phase with respect to each other;

a plurality of amplification sections, which has switching devices, which inputs each of the plurality of pulse signals and performs switching of the direct-current voltage in accordance with the duty ratio of each of the pulse signals, thereby generating a plurality of power-pulse signals which are out of phase; and a filter which combines the plurality of power-pulse signals output from said plurality of amplification sections to generate a combined signal, and filters said combined signal to generate an alternating-current signal, and supplies an alternating-current signal to said load;

each of said plurality of amplification sections includes switching devices, which are coupled to a power source applying a direct-current voltage and perform switching of the direct-current voltage; and said pulse-signal generator inverts the plurality of pulse signals, and outputs the plurality of pulse signals and the plurality of inverted signals to said plurality of amplification sections.

2. A switching amplifier generating pulse signals, setting a duty ratio of each of the pulse signals in accordance with a signal level of an original signal to be amplified, switching a direct-current voltage in accordance with each of the pulse signals, and filtering the pulse signals, thereby amplifying the original signal and supplying a load with the amplified signal, said amplifier comprising:

a pulse-signal generator which generates the pulse signals, each of which has a duty ratio corresponding to the signal level of the original signal and is out of phase with respect to each other;

a plurality of amplification sections, which has switching devices, which inputs each of the plurality of pulse signals and performs switching of the direct-current voltage in accordance with the duty ratio of each of the pulse signals, thereby generating a plurality of power-pulse signals which are out of phase;

a filter which combines the plurality of power-pulse signals output from said plurality of amplification sections to generate a combined signal, and filters said combined signal to generate an alternating-current signal, and supplies an alternating-current signal to said load;

a shifting section which shifts a phase of a clock signal by predetermined degrees, so as to generate shifted clock signals;

a reference signal generator which generates reference signals from the shifted clock signals which are output from said shifting section;

a modulator which compares the original signal to be amplified with the reference signals, thereby modulating the duty ratio of each of the plurality of pulse signals mid supplying switching devices of each of the amplification sections with the pulse signals; and an inverter which inverts each of the plurality of pulse signals whose duty ratio has been modulated, and supplies the switching devices of each of the amplification sections with the pulse signals, respectively; wherein said pulse-signal generator includes:
 a comparing-reference signal generator which generates a comparing-reference signal in accordance with phases of the clock signals;
 a first pulse-signal generator which compares the original signal to be amplified with the comparing-reference signal generated by said comparing-reference signal generator, so as to output a first pulse signal;
 a first inverted-pulse signal generator which inverts said first pulse signal generated by said first pulse-signal generator, so as to output a first inverted pulse signal;
 an original-signal inverter which inverts the original signal to be amplified;
 a second pulse-signal generator which compares the signal, inverted by said original-signal inverter, with the comparing-reference signal generated by said comparing-reference signal generator, so as to output a second pulse signal;
 a second inverted-pulse signal generator which inverts said second pulse signal generated by said second pulse-signal generator, so as to output a second inverted pulse signal.

3. A switching amplifier generating pulse signals, setting a duty ratio of each of the pulse signals in accordance with a signal level of an original signal to be amplified, switching a direct-current voltage in accordance with each of the anise signals, and filtering the pulse signals, thereby amplifying the original signal and supplying a load with the amplified signal, said amplifier comprising:

a pulse-signal generator which generates the pulse signals, each of which has a duty ratio corresponding to the signal level of the original signal and is out of phase with respect to each other;

a plurality of amplification sections, which has switching devices, which inputs each of the plurality of pulse signals and performs switching of the direct-current volume in accordance with the duty ratio of each of the pulse signals, thereby generating a plurality of, power-pulse signals which are out of phase; and a filter which combines the plurality of power-pulse signal output from said plurality of amplification sections to generate a combined signal, and filters said combined signal to generate an alternating-current signal, and supplies an alternate-current signal to said load; wherein
 said pulse-signal generator comprises a frequency modulator which generates pulse signals whose phases are shifted from each other and whose frequencies are modulated in accordance with the signal level of the original signal.

4. A switching amplifier, generating pulse signals, setting a duty ratio of each of the pulse signals in accordance with a signal level of an original signal to be amplified, switching a direct-current voltage in accordance with each of the pulse signals, and filtering the pulse signals, thereby amplifying the original signal and supplying a load with the amplified signal, said amplifier comprising:

a pulse-signal generator which generates the pulse signals, each of which has a duty ratio corresponding to the signal level of the original signal and is out of phase with respect to each other;

a plurality of amplification sections, which has switching devices, which inputs each of the plurality of pulse signals and performs switching of the direct-current voltage in accordance with the duty ratio of each of the pulse signals, thereby generating a plurality of power-pulse signals which are out of phase, wherein each of the plurality of amplification sections includes two switching devices, which are arranged in series and accept the direct-current voltage supplied thereto; and a filter which combines and filters the plurality of power-pulse signals output from said plurality of amplification sections, and supplies said load with the combined and filtered power-pulse signals; and wherein:
 said load is coupled to a coupling point of the two serially-arranged switching devices of each of the plurality of amplification sections, through said filter, thereby forming a full-bridge circuit; and
 said pulse-signal generator generates a plurality of pulse signals, which we out of phase with each other, and their inverted signals, and supplies each pair of one of the pulse signals and respective inverted signals to the two serially-arranged switching devices of respective one of said amplification sections.

5. A switching amplifier, generating pulse signals, setting a duty ratio of each of the pulse signals in accordance with a signal level of an original signal to be amplified, switching a direct-current voltage in accordance with each of the pulse signals, and filtering the pulse signals, thereby amplifying the original signal and supplying a load with the amplified signal, said amplifier comprising:

a pulse-signal generator which generates the pulse signals, each of which has a duty ratio corresponding to the signal level of the original signal and is out of phase with respect to each other;

a plurality of amplification sections, which has switching devices, which inputs each of the plurality of pulse signals and performs switching of the direct-current voltage in accordance with the duty ratio of each of the pulse signals, thereby generating a plurality of power-pulse signals which are out of phase;

a filter which combines and filters the plurality of power-pulse signals output from said plurality of amplification sections, and supplies said load with the combined and filtered power-pulse signals;

a shifting section which shifts a phase of a clock signal by predetermined degrees, so as to generate shifted clock signals;

a reference signal generator which generates reference signals (S4, S8) from the shifted clock signals which are output from said shifting section;

a modulator which compares the original signal to be amplified with the reference signals, thereby modulating the duty ratio of each of the plurality of pulse signals and supplying switching devices of each of the amplification sections with the pulse signals; and an inverter which inverts each of the plurality of pulse signals whose duty ratio has been modulated, and supplies the switching devices of each of the amplification sections with the pulse signals, respectively; and wherein said pulse-signal generator includes:

a comparing-reference signal generator which generates a comparing-reference signal in accordance with phases of the clock signals;

a first pulse-signal generator which compares the original signal to be amplified with the comparing-reference signal generated by said comparing-reference signal generator, so as to output a first pulse signal;

a first inverted-pulse signal generator which inverts said first pulse signal generated by said first pulse-signal generator, so as to output a first inverted pulse signal;

an original-signal inverter which inverts the original signal to be amplified;

a second pulse-signal generator which compares the signal, inverted by said original-signal inverter, with the comparing-reference signal generated by said comparing-reference signal generator, so as to output a second pulse signal;

a second inverted-pulse signal generator which inverts said second pulse signal generated by said second pulse-signal generator, so as to output a second inverted pulse signal.

* * * * *

UNITED STATES PATENT AND TRADEMARK OFFICE
CERTIFICATE OF CORRECTION

PATENT NO. : 6,788,137 B2
DATED : September 7, 2004
INVENTOR(S) : Koicho Morita

It is certified that error appears in the above-identified patent and that said Letters Patent is hereby corrected as shown below:

Column 18,
Line 52, please insert -- wherein -- after the word "load."

Column 19,
Line 26, please replace the word "mid" with -- and --.
Line 60, please replace the word "anise" with -- pulse --.

Column 20,
Line 4, please replace the word "volume" with -- voltage --.
Line 5, please delete the comma after "of.".
Line 7, please replace the word "signal" with -- signals. --.
Line 11, please replace the word "alternate" with -- alternating --.
Line 50, please replace the word "we" with -- are --.

Signed and Sealed this

Twenty-first Day of December, 2004

JON W. DUDAS
*Director of the United States Patent and Trademark Office*